United States Patent
Haba et al.

(10) Patent No.: US 12,368,087 B2
(45) Date of Patent: Jul. 22, 2025

(54) EMBEDDED COOLING SYSTEMS FOR ADVANCED DEVICE PACKAGING AND METHODS OF MANUFACTURING THE SAME

(71) Applicant: Adeia Semiconductor Bonding Technologies Inc., San Jose, CA (US)

(72) Inventors: Belgacem Haba, Saratoga, CA (US); Rajesh Katkar, Milpitas, CA (US); Ron Zhang, Sunnyvale, CA (US); Thomas Workman, San Jose, CA (US); Gaius Gillman Fountain, Jr., Youngsville, NC (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/792,115

(22) Filed: Aug. 1, 2024

(65) Prior Publication Data

US 2025/0210459 A1  Jun. 26, 2025

Related U.S. Application Data

(60) Provisional application No. 63/575,139, filed on Apr. 5, 2024, provisional application No. 63/550,738, filed (Continued)

(51) Int. Cl.
*H01L 23/34* (2006.01)
*H01L 21/48* (2006.01)
(Continued)

(52) U.S. Cl.
CPC ........ *H01L 23/473* (2013.01); *H01L 21/4807* (2013.01); *H01L 21/4882* (2013.01);
(Continued)

(58) Field of Classification Search
CPC .............. H01L 23/473; H01L 21/4807; H01L 21/4882; H01L 23/3135; H01L 23/427;
(Continued)

(56) References Cited

U.S. PATENT DOCUMENTS

| | | |
|---|---|---|
| 4,274,479 A | 6/1981 | Eastman |
| 5,309,986 A | 5/1994 | Itoh |

(Continued)

FOREIGN PATENT DOCUMENTS

| | | |
|---|---|---|
| CN | 109524373 A | 3/2019 |
| CN | 111128976 A | 5/2020 |

(Continued)

OTHER PUBLICATIONS

Evan G. Colgan, "A Practical Implementation Of Silicon Microchannel Coolers", available online at <https://www.electronics-cooling.com/2007/11/a-practical-implementation-of-silicon-microchannel-coolers/>, Nov. 1, 2007, 10 pages.

(Continued)

*Primary Examiner* — Niki H Nguyen
(74) *Attorney, Agent, or Firm* — Haley Guiliano LLP

(57) ABSTRACT

A device package comprising an integrated cooling assembly comprising a semiconductor device and a cold plate directly bonded to the semiconductor device. The cold plate comprises a top portion, sidewalls extending downwardly from the top portion to a backside of the semiconductor device, an inlet opening, and an outlet opening. The top portion, the sidewalls, and the backside of the semiconductor device collectively define a coolant chamber volume therebetween. The inlet opening and the outlet opening are disposed in the top portion and are in fluid communication with the coolant chamber volume. The inlet opening is disposed above a hotspot region of the semiconductor device.

20 Claims, 16 Drawing Sheets

Related U.S. Application Data on Feb. 7, 2024, provisional application No. 63/614,742, filed on Dec. 26, 2023.

(51) Int. Cl.
| | |
|---|---|
| *H01L 23/00* | (2006.01) |
| *H01L 23/10* | (2006.01) |
| *H01L 23/31* | (2006.01) |
| *H01L 23/427* | (2006.01) |
| *H01L 23/473* | (2006.01) |
| H01L 25/18 | (2023.01) |
| H05K 1/02 | (2006.01) |
| H10B 80/00 | (2023.01) |

(52) U.S. Cl.
CPC .......... *H01L 23/10* (2013.01); *H01L 23/3135* (2013.01); *H01L 23/427* (2013.01); *H01L 24/05* (2013.01); *H01L 24/08* (2013.01); *H01L 24/80* (2013.01); *H01L 24/16* (2013.01); *H01L 24/32* (2013.01); *H01L 24/73* (2013.01); *H01L 25/18* (2013.01); *H01L 2224/05541* (2013.01); *H01L 2224/05551* (2013.01); *H01L 2224/05687* (2013.01); *H01L 2224/08225* (2013.01); *H01L 2224/08245* (2013.01); *H01L 2224/16225* (2013.01); *H01L 2224/32225* (2013.01); *H01L 2224/73204* (2013.01); *H01L 2224/80895* (2013.01); *H01L 2224/80896* (2013.01); *H01L 2924/3511* (2013.01); *H01L 2924/35121* (2013.01); *H05K 1/0203* (2013.01); *H05K 2201/10325* (2013.01); *H05K 2201/10409* (2013.01); *H05K 2201/10704* (2013.01); *H10B 80/00* (2023.02)

(58) Field of Classification Search
CPC ......... H01L 24/05; H01L 24/80; H01L 24/16; H01L 24/32; H01L 25/18; H01L 2224/05541; H01L 2224/05551; H01L 2224/05687; H01L 2224/08225; H01L 2224/16225; H01L 2224/32225; H01L 2224/73204; H01L 2224/80895; H01L 2224/80896; H01L 2924/3511; H01L 23/400601; H01L 123/427; H01L 23/4093; H01L 23/3672; H01L 23/367; H01L 2023/4081; H01L 23/46; H01L 23/3677; H01L 23/40; H01L 2023/4087; H01L 2023/405; H01L 2023/4062; H01L 23/36; H10B 80/00; H05K 7/20836; H05K 7/20272; H05K 7/20763; H05K 7/20254; H05K 7/208; H05K 7/20509; H05K 7/20745; H05K 7/20336; H05K 7/20263; H05K 7/20318; H05K 7/20381; H05K 7/20218; H05K 7/20927; H05K 2201/066; H05K 3/0061; H05K 7/1491; H05K 7/20436

See application file for complete search history.

(56) References Cited

U.S. PATENT DOCUMENTS

| | | | |
|---|---|---|---|
| 5,522,452 A | 6/1996 | Mizuno et al. | |
| 5,769,154 A | 6/1998 | Adkins et al. | |
| 6,056,044 A | 5/2000 | Benson et al. | |
| 6,351,384 B1 | 2/2002 | Daikoku et al. | |
| 6,686,532 B1 | 2/2004 | Macris | |
| 6,822,326 B2 | 11/2004 | Enquist et al. | |
| 7,289,326 B2 | 10/2007 | Heydari et al. | |
| 7,485,957 B2 | 2/2009 | Brandenburg et al. | |
| 7,511,372 B2 | 3/2009 | Chiu | |
| 7,523,617 B2 | 4/2009 | Venkatasubramanian et al. | |
| 7,622,324 B2 | 11/2009 | Enquist et al. | |
| 7,692,926 B2 | 4/2010 | Henderson et al. | |
| 7,957,137 B2 | 6/2011 | Prasher | |
| 7,978,473 B2 | 7/2011 | Campbell et al. | |
| 7,997,087 B2 | 8/2011 | Venkatasubramanian et al. | |
| 8,164,169 B2 | 4/2012 | Chrysler et al. | |
| 8,630,091 B2 | 1/2014 | Ward et al. | |
| 9,224,673 B2 | 12/2015 | Chen et al. | |
| 9,299,641 B2 | 3/2016 | Sekar et al. | |
| 9,355,932 B2 * | 5/2016 | Ankireddi .......... H05K 7/20927 |
| 9,391,143 B2 | 7/2016 | Tong et al. | |
| 9,553,071 B1 | 1/2017 | Haba | |
| 9,741,638 B2 | 8/2017 | Hsieh et al. | |
| 9,741,696 B2 | 8/2017 | Katkar et al. | |
| 9,746,248 B2 | 8/2017 | Semenov et al. | |
| 9,768,149 B2 | 9/2017 | Vadhavkar et al. | |
| 9,818,723 B2 | 11/2017 | Haba | |
| 10,032,695 B2 | 7/2018 | Iyengar et al. | |
| 10,083,934 B2 | 9/2018 | Haba | |
| 10,157,818 B2 | 12/2018 | Chen et al. | |
| 10,170,392 B2 | 1/2019 | Chainer et al. | |
| 10,199,356 B2 | 2/2019 | Kinsley | |
| 10,312,221 B1 | 6/2019 | Agarwal et al. | |
| 10,332,823 B2 | 6/2019 | Chen et al. | |
| 10,461,059 B2 | 10/2019 | Koopmans et al. | |
| 10,694,641 B2 | 6/2020 | Basu et al. | |
| 10,978,427 B2 | 4/2021 | Li et al. | |
| 11,187,469 B2 | 11/2021 | Karesh | |
| 11,387,164 B2 | 7/2022 | Wu et al. | |
| 11,598,594 B2 | 3/2023 | Lewis et al. | |
| 11,996,351 B2 | 5/2024 | Hsiao et al. | |
| 12,191,233 B2 * | 1/2025 | Haba .......... H01L 23/32 |
| 2003/0157782 A1 | 8/2003 | Kellar et al. | |
| 2004/0184237 A1 | 9/2004 | Chang | |
| 2004/0251530 A1 | 12/2004 | Yamaji | |
| 2005/0126766 A1 | 6/2005 | Lee et al. | |
| 2005/0213301 A1 | 9/2005 | Prasher | |
| 2006/0042825 A1 | 3/2006 | Lu et al. | |
| 2006/0103011 A1 | 5/2006 | Andry et al. | |
| 2007/0025082 A1 | 2/2007 | Lee et al. | |
| 2007/0107875 A1 | 5/2007 | Lee et al. | |
| 2008/0096320 A1 | 4/2008 | Farrar | |
| 2009/0122491 A1 | 5/2009 | Martin et al. | |
| 2010/0116534 A1 | 5/2010 | Choi et al. | |
| 2010/0230805 A1 | 9/2010 | Refai-Ahmed | |
| 2010/0300202 A1 | 12/2010 | Joyce | |
| 2011/0129986 A1 | 6/2011 | Libralesso et al. | |
| 2013/0044431 A1 | 2/2013 | Koeneman | |
| 2013/0050944 A1 | 2/2013 | Shepard | |
| 2013/0087904 A1 | 4/2013 | Clark et al. | |
| 2014/0126150 A1 | 5/2014 | Song et al. | |
| 2015/0194363 A1 | 7/2015 | Jun et al. | |
| 2016/0276314 A1 | 9/2016 | Ching et al. | |
| 2017/0012016 A1 | 1/2017 | Joshi et al. | |
| 2017/0092565 A1 | 3/2017 | Chen et al. | |
| 2017/0103937 A1 | 4/2017 | Hsieh et al. | |
| 2018/0053730 A1 | 2/2018 | Shao et al. | |
| 2018/0087842 A1 | 3/2018 | Chainer et al. | |
| 2018/0090427 A1 | 3/2018 | Bernstein et al. | |
| 2018/0160565 A1 | 6/2018 | Parida | |
| 2018/0211900 A1 | 7/2018 | Gutala et al. | |
| 2018/0308783 A1 | 10/2018 | Refai-Ahmed et al. | |
| 2019/0008071 A1 | 1/2019 | Kim | |
| 2019/0355706 A1 | 11/2019 | Enquist et al. | |
| 2019/0385928 A1 | 12/2019 | Leobandung | |
| 2020/0035583 A1 | 1/2020 | Beauchemin et al. | |
| 2020/0105639 A1 | 4/2020 | Valavala et al. | |
| 2020/0312742 A1 | 10/2020 | Lofgreen et al. | |
| 2020/0343160 A1 | 10/2020 | Mizerak et al. | |
| 2020/0350233 A1 | 11/2020 | Mizerak et al. | |
| 2020/0352053 A1 * | 11/2020 | Mizerak .......... H05K 7/20772 |
| 2020/0395313 A1 | 12/2020 | Mallik et al. | |
| 2021/0066164 A1 | 3/2021 | Wu et al. | |
| 2021/0175143 A1 | 6/2021 | Yu et al. | |
| 2021/0183741 A1 | 6/2021 | Jha et al. | |
| 2021/0193548 A1 | 6/2021 | Wan et al. | |
| 2021/0193620 A1 | 6/2021 | Refai-Ahmed et al. | |
| 2021/0280497 A1 | 9/2021 | Brun et al. | |

(56) References Cited

U.S. PATENT DOCUMENTS

| | | |
|---|---|---|
| 2021/0288037 A1 | 9/2021 | Tao et al. |
| 2021/0378106 A1 | 12/2021 | Iyengar et al. |
| 2021/0378139 A1 | 12/2021 | Rice et al. |
| 2021/0410329 A1 | 12/2021 | Yang et al. |
| 2022/0037231 A1 | 2/2022 | Hsiao et al. |
| 2022/0087059 A1 | 3/2022 | Sathyamurthy et al. |
| 2022/0117115 A1 | 4/2022 | Malouin et al. |
| 2022/0130734 A1 | 4/2022 | Chiu et al. |
| 2022/0189850 A1 | 6/2022 | Liff et al. |
| 2022/0210949 A1 | 6/2022 | Edmunds et al. |
| 2022/0230937 A1 | 7/2022 | Malouin et al. |
| 2022/0408592 A1 | 12/2022 | Malouin et al. |
| 2023/0048500 A1 | 2/2023 | Malouin et al. |
| 2023/0154828 A1 | 5/2023 | Haba et al. |
| 2023/0156959 A1 | 5/2023 | Malouin et al. |
| 2023/0207474 A1 | 6/2023 | Uzoh et al. |
| 2023/0245950 A1 | 8/2023 | Haba et al. |
| 2023/0284421 A1 | 9/2023 | Malouin et al. |
| 2023/0298969 A1 | 9/2023 | Park et al. |
| 2024/0038633 A1 | 2/2024 | Haba et al. |
| 2024/0203823 A1 | 6/2024 | Uzoh et al. |
| 2024/0222222 A1 | 7/2024 | Haba et al. |
| 2024/0222226 A1 | 7/2024 | Haba |
| 2024/0249995 A1 | 7/2024 | Haba |
| 2024/0249998 A1 | 7/2024 | Gao et al. |
| 2024/0266255 A1 | 8/2024 | Haba et al. |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |

OTHER PUBLICATIONS

Francisco Pires, "TSMC Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.

IBM, "Functional electronic packaging-Thermal management roadmap", available online at <https://web.archive.org/web/20170220095511/https://www.zurich.ibm.com/st/electronicpackaging/cooling.html>, Feb. 20, 2017, 7 pages.

International Search Report and Written Opinion received for PCT Patent Application No. PCT/US23/28942, mailed on Nov. 16, 2023, 12 pages.

International Search Report and Written Opinion received for PCT Patent Application No. PCT/US23/84874, mailed on Apr. 22, 2024, 7 pages.

International Search Report and Written Opinion received for PCT Patent Application No. PCT/US23/85801, mailed on Apr. 26, 2024, 8 pages.

International Search Report and Written Opinion received for PCT Patent Application No. PCT/US23/85816, mailed on Apr. 23, 2024, 11 pages.

International Search Report and Written Opinion received for PCT Patent Application No. PCT/US23/86233, mailed on Apr. 26, 2024, 7 pages.

Kaplan, F. et al., "LoCool: Fighting Hot Spots Locally for System Energy Efficiency" IEEE Transactions on Computer-Aided Design of Intergrated Circuits and Systems, 39(4):895-908 (2020).

U.S. Appl. No. 18/129,567, filed Mar. 31, 2023, First Name Inventor: Cyprian Emeka Uzoh, "Embedded Cooling Systems for Device Packages and Methods of Cooling Packaged Devices".

PCT Application No. PCT/US2024/022253, International Search Report and Written Opinion dated Jul. 17, 2024, 14 pages.

Shamsa, M., et al., "Thermal conductivity of diamond-like carbon films", Applied Physics Letters, vol. 89, No. 16, Oct. 20, 2006, pp. 161921-161921-3.

Wu, C. J., et al., "Ultra High Power Cooling Solution for 3D-Ics", 2021 Symposium on VLSI Technology, Jun. 2021, 2 pages.

"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.

"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.

"Microconvective Liquid Cooling for high power electronics," https://jetcool.com/technology/, downloaded Mar. 7, 2024, 6 pages.

Benson D.A. et al., "Micro-Machined Heat Pipes in Silicon MCM Substrates", Sandia National Laboratories, Sandia Report: SAND97-0100-UC-704, printed Jan. 1997, 17 pages.

International Search Report and Written Opinion mailed Jun. 5, 2024, in International Application No. PCT/US2024/013758, 9 pages.

International Search Report and Written Opinion mailed Mar. 16, 2023, in International Application No. PCT/US2022/050105, 9 pages.

International Search Report and Written Opinion mailed May 30, 2023, in International Application No. PCT/US2023/061494, 9 pages.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.

Walsh, Stephen Michael, "Microjet Impingement Cooling of High Power-Density Electronics," Thesis, submitted May 11, 2018, 93 pages.

Lien, Yu-Jen, et al., "An Energy-efficient Si-integrated Micro-cooler for High Power and Power-density Computing Applications", 2024 IEEE 74th ECTC, 5 pages.

\* cited by examiner

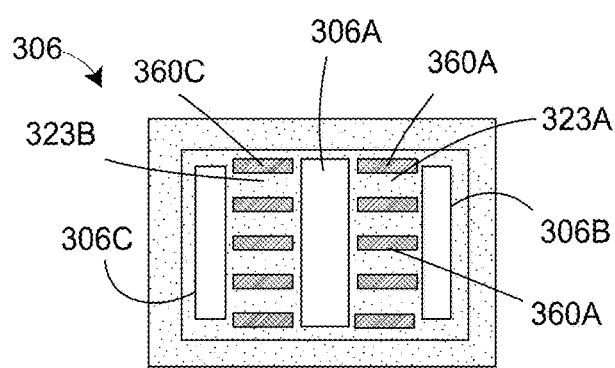
FIG. 3
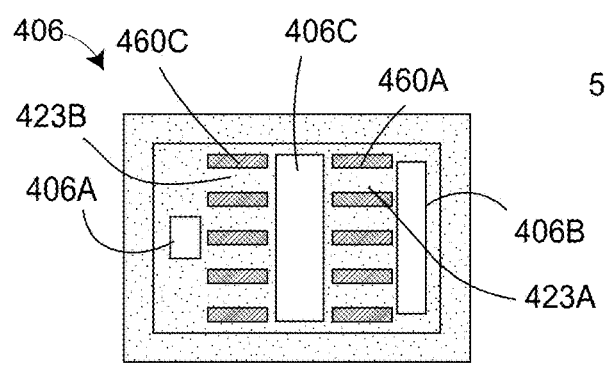
FIG. 4
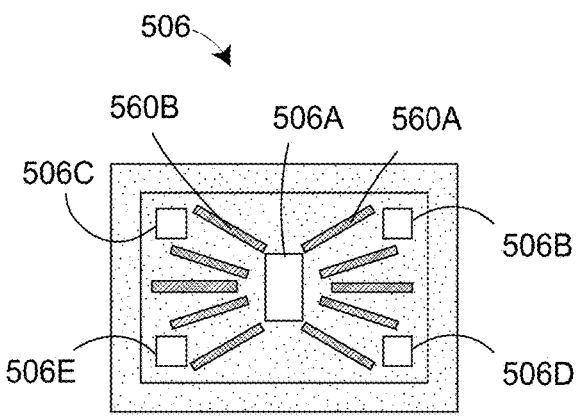
FIG. 5
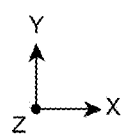

EMBEDDED COOLING SYSTEMS FOR ADVANCED DEVICE PACKAGING AND METHODS OF MANUFACTURING THE SAME

CROSS-REFERENCE TO RELATED APPLICATIONS

This application claims the benefit of U.S. Provisional Patent Application No. 63/614,742 filed Dec. 26, 2023, U.S. Provisional Patent Application No. 63/550,738 filed Feb. 7, 2024, and U.S. Provisional Patent Application No. 63/575,139 filed Apr. 5, 2024, each of which is hereby incorporated by reference herein in its entirety.

FIELD

The present disclosure relates to advanced packaging for microelectronic devices, and in particular, cooling systems for device packages and methods of manufacturing the same.

BACKGROUND

Energy consumption poses a critical challenge for the future of large-scale computing as the world's computing energy requirements are rising at a rate that most would consider unsustainable. Some models predict that the information, communication and technology (ICT) ecosystem could exceed 20% of global electricity use by 2030, with direct electrical consumption by large-scale computing centers accounting for more than one-third of that energy usage. A significant portion of the energy used by such large-scale computing centers is devoted to cooling, since even small increases in operating temperatures can negatively impact the performance of microprocessors, memory devices, and other electronic components. While some of this energy is expended to operate the cooling systems that are directly cooling the chips (e.g., heat spreaders, heat pipes, etc.), energy consumption/costs for indirect cooling can also be quite staggering. Indirect cooling energy costs include, for example, cooling or air conditioning of data center buildings. Data center buildings can house thousands, to tens of thousands or more, of high performance chips in server racks, and each of those high performance chips is a heat source. An uncontrolled ambient temperature in a data center will adversely affect the performance of the individual chips, and the data center system performance as a whole.

Thermal dissipation in high-power density chips (semiconductor devices/die) is also a critical challenge as improvements in chip performance, e.g., through increased gate or transistor density due to advanced processing nodes, evolution of multi-core microprocessors, etc., have resulted in increased power density and a corresponding increase in thermal flux that contributes to elevated chip temperatures. Higher density of transistors also increases the length of metal wiring on the chips, which generates its own additional thermal flux due to Joule heating of these wires due to higher currents. These elevated temperatures are undesirable as they can degrade the chip's operating performance, efficiency, reliability, and amount of remaining life. Cooling systems used to maintain the chip at a desired operating temperature typically remove heat using one or more heat dissipation devices, e.g., thermal spreaders, heat pipes, cold plates, liquid cooled heat pipe systems, thermal-electric coolers, heat sinks, etc. One or more thermal interface material(s), such as, for example, thermal paste, thermal adhesive, or thermal gap filler, may be used to facilitate heat transfer between the surfaces of a chip and heat dissipation device(s). A thermal interface material(s) (TIM(s)) is any material that is inserted between two components to enhance the thermal coupling therebetween. Unfortunately, the combined thermal resistance of (i) the thermal resistance of interfacial boundary regions between a TIM(s) and the chip and/or the heat dissipation device(s), and (ii) the thermal resistance of a thermal interface material(s) itself can inhibit heat transfer from the chip to the heat dissipation devices, undesirably reducing the cooling efficiency of the cooling system.

Generally speaking, there are multiple components between the heat dissipating sources (i.e., active circuitry) in the chips and the heat dissipation devices, each of which contributes to the system thermal resistance cumulatively along the heat transfer paths and raises chip junction temperatures from the ambient.

Such cooling systems can suffer from reduced cooling efficiency due to the design and manufacture of system components.

Accordingly, there exists a need in the art for improved energy-efficient cooling systems, by reducing system thermal resistance, and methods of manufacturing the same.

SUMMARY

Embodiments herein provide integrated cooling assemblies embedded in advanced device packages. Advantageously, the integrated cooling assemblies deliver appropriate cooling directly to one or more regions of a semiconductor device to obtain temperature uniformity across the device.

A first general aspect includes, a device package comprising an integrated cooling assembly. The integrated cooling assembly comprises a semiconductor device and a cold plate directly bonded to the semiconductor device. The cold plate comprises a top portion, sidewalls extending downwardly from the top portion to a backside of the semiconductor device, an inlet opening and an outlet opening. The top portion, the sidewalls, and the backside of the semiconductor device collectively define a coolant chamber volume therebetween. The inlet opening and the outlet opening are disposed in the top portion and are in fluid communication with the coolant chamber volume. The inlet opening is disposed above a hotspot region of the semiconductor device.

In some embodiments, the outlet opening may be disposed above an adjacent region. The semiconductor device may operate at a first temperature in the hotspot region and operate at a second temperature in the adjacent region The first temperature may be greater than the second temperature.

In some embodiments, the semiconductor device may comprise at least one of a computational core, neural core or graphical processing unit disposed in the hotspot region and at least one of a memory block, I/O block, PHY unit, SERDES block or analog block disposed in the adjacent region.

In some embodiments, the inlet opening and the outlet opening comprise different cross-sectional dimensions.

In some embodiments, the device package further comprises a divider extending downwardly from the top portion to the backside of the semiconductor device, wherein the divider extends laterally between the inlet opening and the outlet opening to define a fluid channel therebetween.

A second general aspect includes a device package comprising an integrated cooling assembly. The integrated cooling assembly comprises a semiconductor device and a cold plate directly bonded to the semiconductor device. The cold plate comprises a base surface and cavity sidewalls extending downwardly from the base surface to a backside of the semiconductor device. The cold plate further comprises an inlet opening, a first outlet opening, and a second outlet opening. The base surface, the cavity sidewalls, and the backside of the semiconductor device collectively define a coolant channel therebetween. The inlet opening, the first outlet opening and the second outlet opening are in fluid communication with the coolant channel. The inlet opening is disposed between the first and second outlet openings and is laterally offset from a hotspot region of the semiconductor device.

A third general aspect includes a method of using a device package according to the first general aspect. The method comprises supplying fluid into the inlet opening, and out of the outlet opening to directly cool the semiconductor device.

A fourth general aspect includes a method of manufacturing a device package according to the first general aspect. The method comprises forming a cold plate comprising an inlet opening and an outlet opening, and directly bonding the cold plate to a substrate comprising the semiconductor device.

A fifth general aspect includes a method of manufacturing a device package according to the second general aspect. The method comprises forming a cold plate comprising an inlet opening, a first outlet opening, and a second outlet opening. The method further comprises directly bonding the cold plate to a substrate comprising the semiconductor device.

BRIEF DESCRIPTION OF THE DRAWINGS

The above and other objects and advantages of the disclosure will be apparent upon consideration of the following detailed description, taken in conjunction with the accompanying drawings, in which:

FIG. 3 is a schematic of a cold plate, in accordance with one or more embodiments;

FIG. 4 is schematic of a cold plate, in accordance with one or more embodiments;

FIG. 5 is schematic of a cold plate, in accordance with one or more embodiments;

Figure 1:
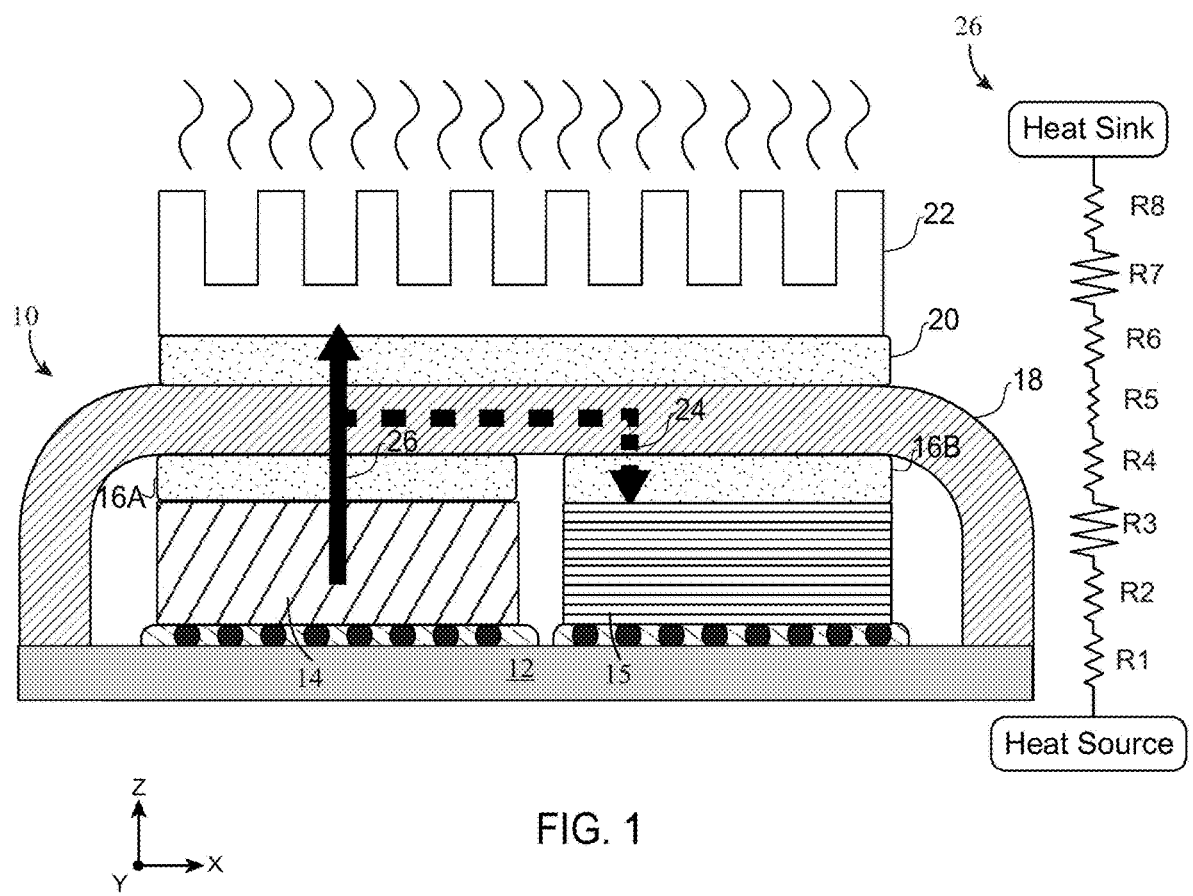
FIG. 1 illustrates a device package with an external heat sink.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

Embodiments herein provide for integrated cooling assemblies embedded within a device package. The integrated cooling assemblies may reduce a temperature difference across the device to improve temperature uniformity.

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed or mounted. The term "substrate" also includes semiconductor substrates that provide a supporting material upon which elements of a semiconductor device are fabricated or attached, and any material layers, features, and/or electronic devices formed thereon, therein, or therethrough. Examples of substrate material that may be used in applications that generate high thermal density include, but are not limited to, Si, GaN, SiC, InP, GaP, InGaN, AlGaInP, AlGaAs, etc.

As described below, the semiconductor substrates herein generally have a "device side," e.g., the side on which semiconductor device elements are fabricated, such as transistors, resistors, and capacitors, and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that forms the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal, e.g., after substrate thinning operations. Depending on the stage of device fabrication or assembly, the terms "active sides" and "non-active sides" are also used to describe surfaces of material layers or features formed on, in, or through the semiconductor substrate, whether or not the material layers or features are ultimately present in the fabricated or assembled device. For example, in some instances, the term "active side" is used to indicate a surface of a substrate that will in the future, but does not yet, include semiconductor device elements.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," "top," "bottom" and the like are generally made with reference to the X, Y, and Z directions set forth by X, Y and Z axes in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," and the like, either alone or in combination with a spatially relevant term, include both relationships with intervening elements and direct relationships where there are no intervening elements. Furthermore, the term "horizontal" is generally made with reference to the X-axis direction and the Y-axis direction set forth in the drawings. The term "vertical" is generally made with reference to the Z-axis direction set forth in the drawings.

Various embodiments disclosed herein include bonded structures in which two or more elements are directly bonded to one another without an intervening adhesive (referred to herein as "direct bonding," "direct dielectric bonding," or "directly bonded"). The resultant bonds formed by this technique may be described as "direct bonds" and/or "direct dielectric bonds". In some embodiments, direct bonding includes the bonding of a single material on the first of the two or more elements and a single material on a second one of the two or more elements, where the single material on the different elements may or may not be the same. For example, bonding a layer of one inorganic dielectric (e.g., silicon oxide) to another layer of the same or different inorganic dielectric. As discussed in more detail below, the process of direct bonding (e.g., direct dielectric bonding) provides a reduction of thermal resistance between a semiconductor device and a cold plate. Examples of dielectric materials used in direct bonding include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. Direct bonding can also include bonding of multiple materials on one element to multiple materials on the other element (e.g., hybrid bonding). As used herein, the term "hybrid bonding" refers to a species of direct bonding having both i) at least one (first) nonconductive feature directly bonded to another (second) nonconductive feature, and ii) at least one (first) conductive feature directly bonded to another (second) conductive feature, without any intervening adhesive. The resultant bonds formed by this technique may be described as "hybrid bonds" and/or "direct hybrid bonds". In some hybrid bonding embodiments, there are many first conductive features, each directly bonded to a second conductive feature, without any intervening adhesive. In some embodiments, nonconductive features on the first element are directly bond to nonconductive features of the second element at room temperature without any intervening adhesive, which is followed by bonding of conductive features of the first element directly bonded to conductive features of the second element via annealing at slightly higher temperatures (e.g., >100° C., >200° C., >250° C., >300° C., etc.)

Unless otherwise noted, the terms "cooling assembly" and "integrated cooling assembly" generally refer to a semiconductor device and a cold plate attached to the semiconductor device. Typically, the cold plate is formed with recessed surfaces that define one or more fluid cavities (e.g., coolant chamber volume(s) or coolant channel(s)) between the cold plate and the semiconductor device. In embodiments where the cold plate is formed with plural fluid cavities, each fluid cavity may be defined by cavity dividers and/or sidewalls of the cold plate. For example, cavity dividers may be spaced apart from each other and extend laterally between opposing cold plate sidewalls (e.g., in one direction between a first pair of opposing cold plate sidewalls, or in two directions between orthogonal pairs of opposing cold plate sidewalls). The cavity dividers and the cold plate sidewalls may collectively define adjacent fluid cavities therebetween. The cold plate may comprise a polymer material.

The cold plate may be attached to the semiconductor device by use of a compliant adhesive layer or by direct bonding or hybrid bonding. Direct bonding may include direct dielectric bonding techniques as described herein, and may give rise to direct dielectric bonds. Hybrid bonding may include hybrid bonding techniques as described herein, and may give rise to direct hybrid bonds. For example, the cold plate may include material layers and/or metal features that facilitate direct bonding or hybrid bonding with the semiconductor device. Beneficially, the backside of the semiconductor device is directly exposed to coolant fluids flowing through the integrated cooling assembly, thus providing for direct heat transfer therebetween. Unless otherwise noted, the integrated cooling assemblies described herein may be used with any desired fluid, e.g., liquid, gas, and/or vapor-phase coolants, such as water, glycol, etc.

Exemplary fluids available for use in the various thermal solution embodiments include: water (either purified or deionized), a glycol (e.g., ethylene glycol, propylene glycol), glycols mixed with water (e.g., ethylene glycol mixed with water (EGW) or propylene glycol mixed with water (PGW)), dielectric fluids (e.g. fluorocarbons, polyalphaolefin (PAO), isoparaffins, synthetic esters, or very high viscosity index (VHVI) oils), or mineral oils. Additionally, depending upon design and operating conditions, these fluids may be used in single-phase liquid, single-phase vapor, two-phase liquid/vapor or two-phase solid/liquid. All of these fluids and fluid mixtures will alter the thermohydraulic and heat transfer properties by altering the temperatures where phase change occurs, as well as meeting design temperature and pressure conditions for the component being cooled or warmed and the thermal solution being deployed. Additionally, multiple combinations of the fluid phases may be employed in various hybrid configurations to meet the particular cooling or warming needs of a respective implementation and still be within the scope of the contemplated embodiments.

Additionally, in some embodiments part or all the cooling is provided by gases. Exemplary gases include atmospheric air and/or one or more inert gases such as nitrogen. Atmospheric air may be taken to mean the mixture of different gases in Earth's atmosphere made up of about 78% nitrogen and 21% oxygen.

Depending on the design needs of a thermal solution system using the disclosed embodiments, engineered dielectric cooling fluids may be used. Some examples of dielectric fluids used for cooling semiconductors include: 3M™ Fluorinert™ Liquid FC-40—A non-flammable, dielectric fluid that can be used in direct contact with live electronics; 3M™ Novec™ Engineered Fluids—A non-flammable, dielectric fluid that can be used in direct contact with live electronics; Galden® PFPE (perfluoropolyether) products used as heat transfer fluids; EnSolv Fluoro HTF—A solvent with a high boiling point and low pour point that can be used for semiconductor wafer cooling. It is understood that in the selection of the cooling fluid, system design aspects such as operating temperatures and pressures, fluid flow rates, fluid viscosity, and other properties will require evaluation when selecting the appropriate cooling fluid.

In some embodiments, the cooling fluids may contain microparticles and/or nanoparticle additives to enhance the conductivity of the cooling fluid within the integrated cooling assemblies. Choi and Eastman (1995) from Argonne National Laboratory, U.S.A. (Yu et al., 2007) coined the word "nanofluid". Nanofluids are engineered fluids prepared by suspending the nano-sized (1-100 nm) particles of metals/non-metals and their oxide(s) with a base/conventional fluid. The suspension of high thermal conductivity metals/non-metals and their oxides nanoparticles enhances the thermal conductivity and heat transfer ability, etc. of the base fluid. The additives to the underlying cooling fluid may comprise for example, nanoparticles of carbon nanotube, nanoparticles of graphene, or nanoparticles of metal oxides. When the cooling fluid contains microparticles, the microparticles are typically 10 microns or less in diameter. Silicon oxide microparticles may be used.

The volume concentration of these micro or nanoparticles may be less than 1%, less than 0.2%, or less than 0.05%. Depending upon the liquid and micro/nanoparticle type chosen for the cooling fluid, higher volume concentrations of 10% or less, 5% or less, or 2% or less may be used. The cooling fluids may also contain small amounts of glycol or glycols (e.g. propylene glycol, ethylene glycol etc.) to reduce frictional shear stress and drag coefficient in the cooling fluid within the integrated cooling assembly. The availability of different base fluids (e.g., water, ethylene glycol, mineral or other stable oils, etc.) and different nanomaterials provide a variety of nanomaterial options for nanofluid solutions to be used in the various embodiments. These nanomaterial option groups such as aforementioned metals (e.g., Cu, Ag, Fe, Au, etc.), metal oxides (e.g., $TiO_2$, $Al_2O_3$, CuO, etc.), carbons (e.g. CNTS, graphene, diamond, graphite . . . etc.), or a mixture of different types of nanomaterials. Metal nanoparticles (Cu, Ag, Au . . . ), metal oxide nanoparticles ($Al_2O_3$, $TiO_2$, CuO), and carbon-based nanoparticles are commonly employed elements. Silicon oxide nanoparticles may also be used. Using cooling fluids with micro and/or nanoparticles when practicing the various embodiments disclosed herein can result in increased heat removal efficiencies and effectiveness.

The fluid control design aspects of specific embodiments may require the nanofluids to be magnetic to facilitate either movement or cessation of movement of the fluids within the semiconductor structures. Magnetic nanofluids (MNFs) are suspensions of a non-magnetic base fluid and magnetic nanoparticles. Magnetic nanoparticles may be coated with surfactant layers such as oleic acid to reduce particle agglomeration and/or settling. Magnetic nanoparticles used in MNFs are usually made of metal materials (ferromagnetic materials) such as iron, nickel, cobalt, as well as their oxides such as spinel-type ferrites, magnetite ($Fe_3O_4$), and so forth. The magnetic nanoparticles used in MNFs typically range in size from about 1 to 100 nanometers (nm).

This disclosure describes embodiments involving the architecture of system and component elements that can be employed to provide for the cooling of semi-conductor components, packaging, and boards. However, those skilled in the art will appreciate the disclosed components and arrangements can be deployed and used in scenarios where component heat up or thermal warm up is desired for a component that is currently outside the low end of the desired operational range. Components that are outside the low end of their operational range can, if started in a cold environment, experience thermal warping or cracking up to and including thermal overexpansion and contact separation that may impair the successful operation of the system. Therefore, in these scenarios, the architectures and embodiments disclosed herein can be used where the indirect thermal solutions supporting them are repurposed or operated in a hybrid configuration to provide warming fluids or heat transfer media to accomplish the warm-up or heat-up scenario. These scenarios are controlled by systems not shown here to bring temperatures up at a speed or timing that enables the materials to avoid the excessive thermal expansion or unequal thermal expansion that may occur among the materials of the semiconductor or packaging being serviced by the thermal solution. Once the component or packaging is brought up into the normal operating range, it can be safely started and brought to a useful operational state.

Considering the warm-up or heat-up embodiments introduced above, the balance of this disclosure and terms used should be viewed in a light that also considers the design option for such warm-up or heat-up. Thus, where terms such as cooling channel, cooling chamber volume, and cooling port are used, for example, such terms could also be considered as a thermal control channel, a thermal control volume, or a thermal control port, respectively. A person of skill would understand that heat flux or heat transfer would go in a different direction, but the design concepts are similar and can be successfully employed in the various embodiments.

In some embodiments, a cooling channel is a liquid cooling channel, and a liquid may flow through the liquid cooling channel. In some embodiments, the liquid may comprise a water and/or glycol (e.g., propylene glycol, ethylene glycol, and mixtures thereof).

As described below, coolant fluid flowing through a cold plate may be used to control the temperature of semiconductor devices. The fluid flowing across the surface of the semiconductor device absorbs heat and conducts heat away from the semiconductor device.

FIG. 1 is a schematic side view of a device package 10 and a heat sink 22 attached to the device package 10. The device package 10 typically includes a package substrate 12, a first device 14, a device stack 15, a heat spreader 18, and TIM layers 16A, 16B thermally coupling the first device 14 and the device stack 15 to the heat spreader 18. The device package 10 is thermally coupled to the heat sink 22 through a second TIM layer 20. The TIM layers 16A, 16B, 20 facilitate thermal contact between components in the device package 10 and between the device package 10 and the heat sink 22.

As heat flux density increases with increasing power density in advanced semiconductor devices, the cumulative thermal resistance of the system illustrated in FIG. 1 is increasingly problematic as heat cannot be dissipated quickly enough to allow semiconductor devices to run at optimal power. Consequently, the energy efficiency of semiconductor devices is reduced. Furthermore, heat is transferred between semiconductor devices within the device package 10, as shown with heat transfer path 24 (illustrated as a dashed line), where heat may be undesirably transferred from the first device 14 having a high heat flux, such as a central processing unit (CPU) or a graphical processing unit (GPU), to the device stack 15 having low heat flux, such as memory, through the heat spreader 18.

For example, as shown in FIG. 1, each device package component and the respective interfacial boundaries therebetween have a corresponding thermal resistance that forms heat transfer path 26 (illustrated by arrow 26 in FIG. 1). The right-hand side of FIG. 1 illustrates the heat transfer path 26 as a series of thermal resistances R1-R8 between a heat source and a heat sink. Here, R1 is the thermal resistance of the bulk semiconductor material of the first device 14. R3 and R7 are the thermal resistances of the first TIM layers 16A, 16B and the second TIM layer 20, respectively. R5 is the thermal resistance of the heat spreader 18. R2, R4, R6, and R8 represent the thermal resistance at the interfacial region of the components (e.g., contact resistances). In a typical cooling system, R3 and R7 may account for 80% or more of the cumulative thermal resistance of the heat transfer path 26, and R5 may account for 5% or more. R1 of the first device 14 and R2, R4, R6, and R8 of the interfaces account for the remaining cumulative thermal resistance. Accordingly, embodiments described herein provide for integrated cooling assemblies embedded within a device package. The embedded cooling assemblies shorten the thermal resistance path between a semiconductor device and a heat sink and reduce thermal communication between semiconductor devices disposed in the same device package, such as described in relation to the figures below.

Figure 2A:
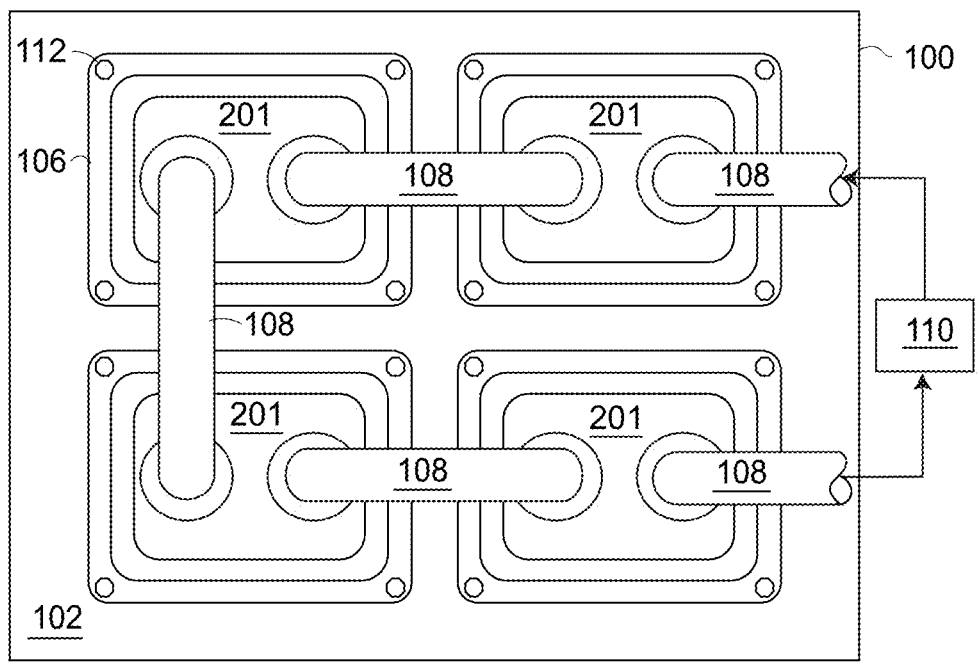
FIG. 2A is a schematic plan view of an example of a system panel, in accordance with embodiments of the present disclosure.
Figure 2A:
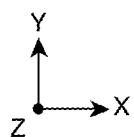

FIG. 2A is a schematic plan view of an example of a system panel 100, in accordance with embodiments of the present disclosure. Generally, the system panel 100 includes a printed circuit board (PCB) 102, a plurality of device packages 201 mounted to the PCB 102, and a plurality of coolant lines 108 fluidly coupling each of the device packages 201 to a coolant source 110. It is contemplated that coolant fluid may be delivered to each of the device packages 201 in any desired fluid phase, e.g., liquid, vapor, gas, or combinations thereof, and may flow out from each device package 201 in the same phase or a different phase. In some embodiments, the coolant fluid is delivered to the device packages 201 and returned therefrom as a liquid, whereby the coolant source 110 may comprise a heat exchanger or chiller to maintain the coolant fluid at a desired temperature. In other embodiments, the coolant fluid may be delivered to the device packages 201 as a liquid, vaporized to a vapor within the device packages 201, and returned to the coolant source 110 as a vapor. In those embodiments, the device packages 201 may be fluidly coupled to the coolant source 110 in parallel, and the coolant source 110 may include or further include a compressor (not shown) for condensing the received vapor to a liquid form.

Figure 2B:
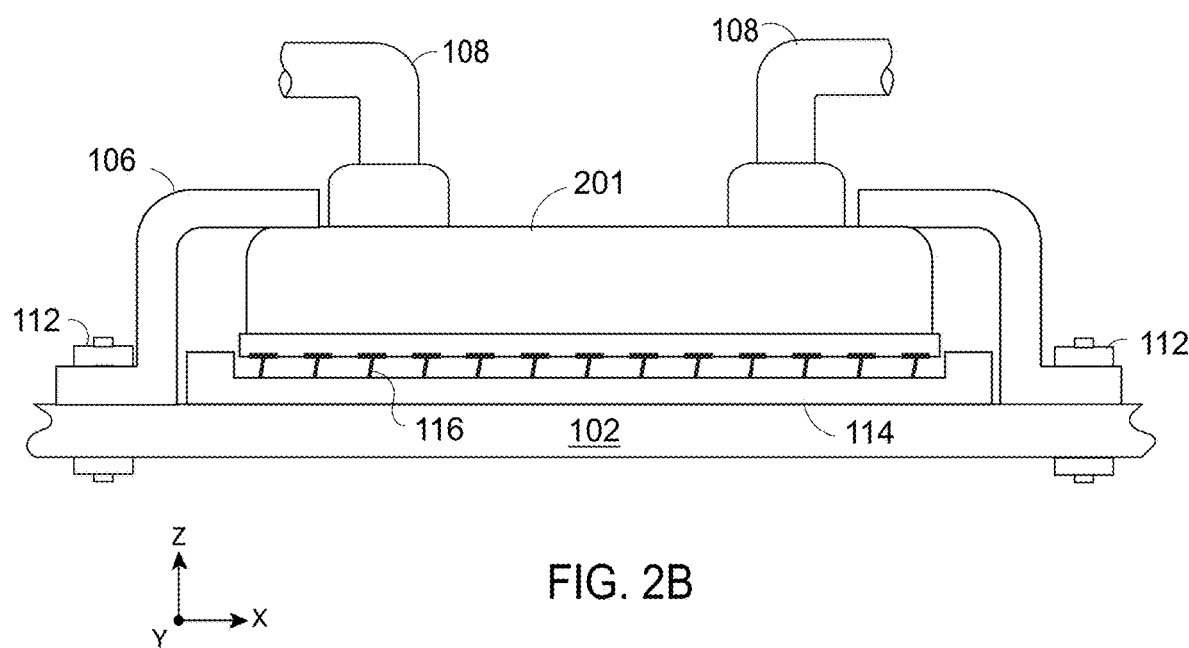
FIG. 2B is a schematic partial sectional side view of a device package mounted on a PCB, in accordance with embodiments of the present disclosure.

FIG. 2B is a schematic partial sectional side view of a portion of the system panel 100 of FIG. 2A. As shown, each device package 201 is fluidly coupled to the plurality of coolant lines 108 and is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112, e.g., compression screws, collectively configured to exert a relatively uniform downward force on the upward facing edges of the device package 201. The uniform downward force ensures proper pin contact between the device package 201 and the socket 114.

Figure 2C:
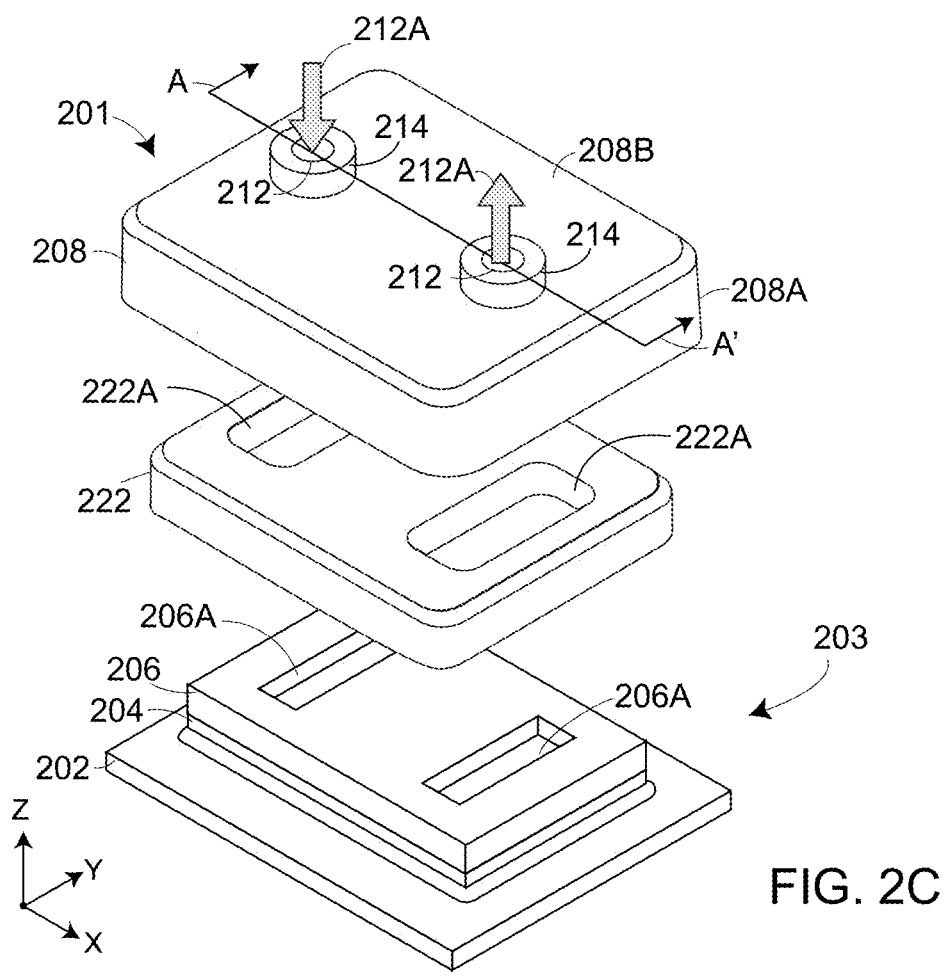
FIG. 2C is a schematic exploded isometric view of the device package in FIG. 2B.

FIG. 2C is a schematic exploded isometric view of an example device package 201, in accordance with embodiments of the present disclosure. Generally, the device package 201 includes a package substrate 202, an integrated cooling assembly 203 disposed on the package substrate 202, and a package cover 208 disposed on a peripheral portion of the package substrate 202. Suitable materials that may be used in the package cover 208 include copper, aluminum, metal alloys, etc. The package cover 208 extends over the integrated cooling assembly 203 so that the integrated cooling assembly 203 is disposed between the package substrate 202 and the package cover 208. The integrated cooling assembly 203 typically includes a semiconductor device 204 and a cold plate 206 bonded to the semiconductor device 204. In some embodiments, the cold plate 206 may comprise substrate material like silicon, glass, ceramic, etc. Although the lateral dimensions (or footprint) of the cold plate 206 are shown to be the same or similar to the lateral dimensions (or footprint) of the semiconductor device 204, the footprint of the cold plate 206 may be smaller or larger in one or both directions when compared to the footprint of the semiconductor device 204.

As shown, the device package 201 further includes a sealing material layer 222 that forms a coolant fluid impermeable barrier between the package cover 208 and the integrated cooling assembly 203 that prevents leaking of the coolant fluid outside of the cooling assembly and prevents coolant fluid from reaching an active side 218 (discussed below in relation to FIG. 2D) of the semiconductor device 204 and causing damage thereto. In some embodiments, the sealing material layer 222 comprises an adhesive material that reliably attaches the package cover 208 to the integrated cooling assembly 203. In some embodiments, the sealing material layer 222 comprises a polymer or epoxy material that extends upwardly from the package substrate 202 to encapsulate and/or surround at least a portion of the semiconductor device 204. In some embodiments, the sealing material layer 222 may also comprise conductive material, e.g., solder. In other embodiments, the sealing material layer 222 is formed from a molding compound, e.g., a thermoset resin, that when polymerized, forms a hermetic seal between the package cover 208 and the cold plate 206. Here, the coolant fluid is delivered to the cold plate 206 through openings 222A disposed through the sealing material layer 222. As shown, the openings 222A are respectively in registration and fluid communication with inlet and outlet openings 212 of the package cover 208 thereabove and inlet and outlet openings 206A in the cold plate 206 therebelow.

It will be understood that the openings are shown in a section view. The openings may have any cross-sectional shape that allows fluid to flow therethrough (e.g., rectangular, square, hexagonal or circular cross-sections). For example, the inlet and outlet openings 206A of the cold plate 206 may form an elongated shape extending from one side of the cold plate 206 to another side of the cold plate 206. For example, the inlet and outlet openings 206A may form any shape having a length greater than a width in the X-Y plane (e.g., a rectangular or a trapezoidal shape). A shape in the X-Y plane of the openings 222A disposed through the sealing material layer 222 may be substantially the same as the shape of the inlet and outlet openings 206A of the cold plate 206 in the same place. Furthermore, it will be understood that all references to an opening throughout the present disclosure refer to an opening defined by a sidewall (e.g., opening sidewall).

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couples the integrated cooling assembly 203 to a system panel, such as the PCB 102.

Figure 2D:
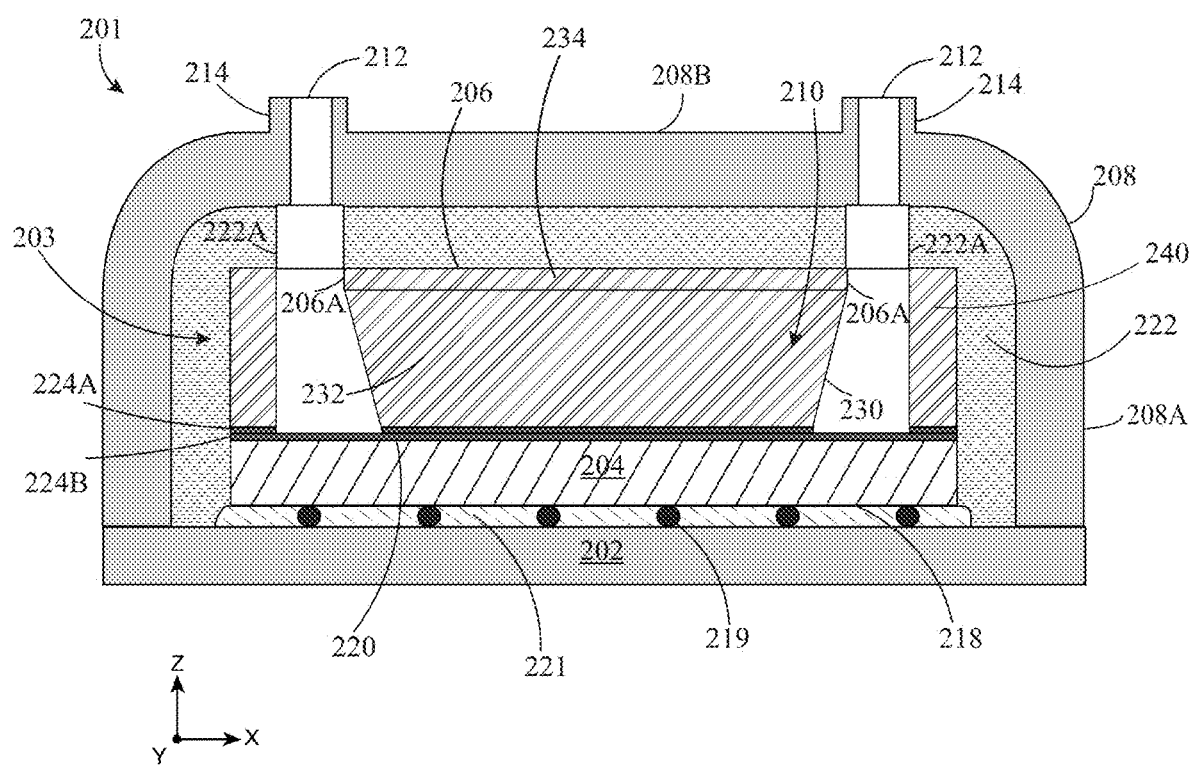
FIG. 2D is a schematic sectional view of an example device package, in accordance with embodiments of the present disclosure, that may be used with the system panel.

FIG. 2D is a schematic sectional view in the X-Z plane of the device package 201 taken along line A-A' of FIG. 2C. As illustrated in FIG. 2D, the semiconductor device 204 includes the active side 218 that includes device components, e.g., transistors, resistors, and capacitors, formed thereon or therein, and a non-active side, here the semiconductor device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the semiconductor device 204 and the package substrate 202. The first underfill layer 221 may comprise a cured polymer resin or epoxy, which provides mechanical support to the conductive bumps 219 and protects against thermal fatigue. In some embodiments, the active side 218 may be electrically connected to another package substrate, another active die, or another passive die (e.g., interposer) using hybrid bonding or conductive bumps 219. The cold plate 206 may be disposed above the package substrate 202 with the semiconductor device 204 disposed therebetween. For example, the semiconductor device 204 (and the first underfill layer 221) may be disposed between the cold plate 206 and the package substrate 202. In some embodiments, the cold plate 206 may be disposed directly on the package substrate 202.

Figure 2E:
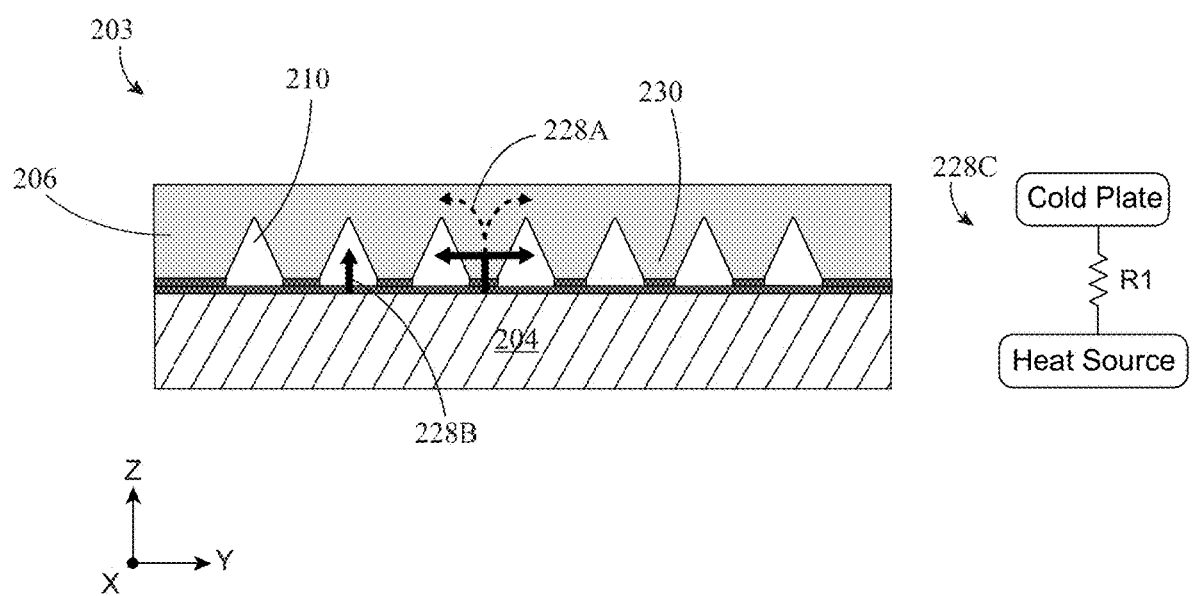
FIG. 2E is a schematic sectional view of an integrated cooling assembly of the device package, in accordance with embodiments of the present disclosure.
Figure 7:
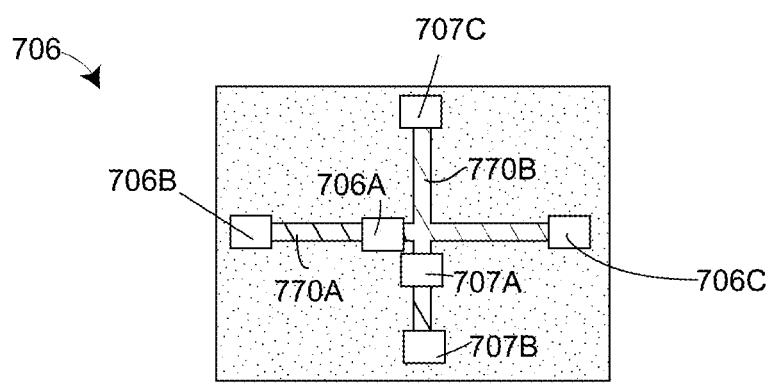
FIG. 7 is schematic of a cold plate, in accordance with one or more embodiments.

Here, the cold plate 206 comprises a top portion 234 and a sidewall 240 (e.g., a perimeter sidewall defining a perimeter of the cold plate 206) extending downwardly from the top portion 234 to the backside 220 of the semiconductor device 204. The top portion 234, the perimeter sidewall 240, and the backside 220 of the semiconductor device 204 collectively define a coolant channel 210 therebetween. The cold plate 206 comprises cavity dividers 230 extending downwardly from the top portion 234 towards the backside 220 of the semiconductor device 204. The cavity dividers 230 may extends laterally and in parallel between an inlet opening 206A of the cold plate 206 and an outlet opening 206A of the cold plate 206 to define coolant channels 210 therebetween. It should be appreciated that, the cold plate 206 may comprise one cavity divider 230 which forms two coolant channels (e.g., one coolant channel on either side of the cavity divider 230) by means of the cavity divider 230 and portions of the perimeter sidewall 240. More specifically, coolant channels 210 may be formed between the cavity divider 230 and a portion of the perimeter sidewall 240 extending parallel to the cavity divider 230. Alternatively, in other embodiments, the cold plate 206 may comprise plural cavity dividers 230, for example two cavity dividers (as illustrated in FIG. 7), five cavity dividers, or six cavity dividers (as illustrated in FIG. 2E). In such examples, the cold plate 206 comprises more than two coolant channels 210, for example three coolant channels, four coolant channels, seven coolant channels, or more, defined between the cavity dividers 230 and/or the cavity divider(s) 230 and the perimeter sidewall 240.

The cavity dividers 230 comprise cavity sidewalls 232 which form surfaces of corresponding coolant channels 210. In embodiments where plural cavity dividers 230 extend in parallel to each other, cavity sidewalls 232 of adjacent cavity dividers 230 are opposite (e.g., facing) each other. In embodiments comprising a single cavity divider 230, a first cavity sidewall may be opposite (e.g., face) a first portion of the perimeter sidewall 240 extending parallel to and facing the first cavity sidewall. A second cavity sidewall may be opposite (e.g., face) a second portion of the perimeter sidewall 240 extending parallel to and facing the second cavity sidewall. The first portion of the perimeter sidewall 240 may be an opposite side of the cold plate 206 to the second portion of the perimeter sidewall 240. For example, in embodiments where the cold plate 206 is rectangular, first and second opposing sides of the rectangular cold plate 206 form the first and second portions of the perimeter sidewall 240.

The cavity dividers 230 may be continuous cavity dividers which extend continuously (e.g., in the Y-axis direction) between the inlet opening 206A and the outlet opening 206A of the cold plate 206.

With reference to FIG. 2D, coolant channels 210 may be defined by:
the backside 220 of the semiconductor device 204, which forms lower coolant channel surfaces;
portions of the perimeter sidewall 240 extending in the Y-axis direction, which form end surfaces of the coolant channels 210;
the cavity sidewalls 232, which form inner surfaces of the coolant channels 210 in the X-axis direction; and
portions of the perimeter sidewall 240 extending in the X-axis direction, which form outer surfaces of the coolant channels 210 in the X-axis direction.

Here, the cavity sidewalls 232 are formed at an acute angle with respect to the backside 220 of the semiconductor device 204 such that upper portions of opposing (e.g., facing) cavity sidewalls 232 meet. Therefore, the cavity sidewalls 232 and the backside 220 of the semiconductor device 204 collectively define a triangular cross-section of the coolant channel 210.

In some embodiments, the backside 220 of the semiconductor device 204 comprises a corrosion protective layer (not shown). The corrosion protective layer may be a continuous layer disposed across the entire backside 220 of the semiconductor device 204, such that the cold plate 206 is attached thereto. Beneficially, the corrosion protective layer provides a corrosion-resistant barrier layer, thus preventing undesired corrosion of the semiconductor device 204 (e.g., the semiconductor substrate material which might otherwise be in direct contact with coolant fluid flowing through a coolant chamber volume 210).

One or more coolant chamber volumes may include one or more coolant channels. The coolant channels may extend between a single inlet opening and a single outlet opening of the cold plate 206, such that the coolant chamber volume(s) and/or coolant channel(s) share the same inlet and outlet openings. In some embodiments, multiple inlet and/or outlet openings may be coupled to the coolant chamber volume(s).

In embodiments having plural coolant chamber volumes and/or plural coolant channels, each coolant chamber volume and/or coolant channel may be connected between a separate inlet opening and a separate outlet opening. In such embodiments, the coolant fluid may be directed to the separate inlet openings and from the separate outlet openings using a manifold disposed above the openings in the Z-axis direction.

In some embodiments, a height in the Z-axis direction of the coolant chamber volume(s) and or coolant channel(s) may be greater than 100 µm, 100 µm-1000 µm, or 100 µm-700 µm. A width in the Y-axis direction of the coolant chamber volume(s) and/or coolant channel(s) may be greater than 100 µm, 100 µm-1000 µm, or 100 µm-700 µm. For example, the width of the coolant chamber volume(s) and/or coolant channel(s) may be greater than the height. A cross-section of the coolant chamber volume(s) and/or coolant channel(s) in the Y-Z plane is wide enough to allow for a pressure drop of 0-20 psi, 3-15 psi, or 4-10 psi.

In some embodiments, preparing a desired surface roughness of the sidewalls of the coolant chamber volume(s) and/or coolant channels may include depositing an organic layer on a photoresist layer after cold plate features have been etched to form a micro-masking layer, such as between 1 to 30 nm. The micro-masking layer may be dry etched to form the desired surface roughness, such as between 0.1 to 3.0 nm.

With reference to FIG. 2D, the cold plate 206 is attached to the backside 220 of the device 204 without the use of an intervening adhesive. For example, the cold plate 206 may be directly bonded to the backside 220 of the device 204, such that the cold plate 206 and the backside 220 of the device 204 are in direct contact. For example, in some embodiments, one or both of the cold plate 206 and the backside 220 of the semiconductor device 204 may comprise a dielectric material layer, e.g., a first dielectric material layer 224A and a second dielectric material layer 224B respectively, and the cold plate 206 is directly bonded to the backside 220 of the semiconductor device 204 through bonds formed between the dielectric material layers 224A, 224B. In some embodiments, one of the cold plate 206 or the backside 220 of the semiconductor device 204 may comprise a thin bonding dielectric layer (e.g., silicon nitride, etc.) and other element(s) may not include any such explicit bonding dielectric layer (or can have only a native oxide layer). The first and second dielectric material layers 224A, 224B may be continuous or non-continuous. For example, the first dielectric material layer 224A may be disposed only on lower surfaces of the cold plate 206 facing the backside 220 of the semiconductor device 204. With reference to FIG. 2E, described below, portions of the first dielectric material layer 224A may be disposed only on lower surfaces of support features 230 and the perimeter sidewall 240. Beneficially, directly bonding the cold plate 206 to the semiconductor device 204, as described above, reduces the thermal resistance therebetween and increases the efficiency of heat transfer from the semiconductor device 204 to the cold plate 206. In particular, thermal resistance is reduced by directly bonding lower surfaces of the cavity dividers 230 facing the semiconductor device 204 to the backside 220 of the semiconductor device 204.

FIG. 2E is a schematic sectional view in the Y-Z plane of the integrated cooling assembly 203. In FIG. 2E, the cold plate 206 comprises a patterned side that faces towards the semiconductor device 204 and an opposite side that faces towards the package cover 208 (not shown). The patterned side comprises a coolant chamber volume having plural coolant channels 210, which extend laterally between the inlet and outlet openings of the cold plate 206. Each coolant channel 210 comprises cavity sidewalls that define a corresponding coolant channel 210. Portions of the cold plate 206 between the cavity sidewalls form support features 230. The support features 230 provide structural support to the integrated cooling assembly 203 and disrupt laminar fluid flow at the interface of the coolant and the device backside 220, resulting in increased heat transfer therebetween. Furthermore, by introducing plural coolant channels 210 to define separate coolant flow paths, an internal surface area of the cold plate 206 is increased, which further increases the efficiency of heat transfer.

In FIG. 2E, arrows 228A and 228B illustrate two different heat transfer paths in the integrated cooling assembly 203. A first heat transfer path illustrated by arrow 228B shows heat generated by the semiconductor device 204 transferring directly from the semiconductor material of the semiconductor device 204 to coolant fluid flowing through the cold plate 206. A second heat transfer path illustrated by arrows 228A shows heat generated by the semiconductor device 204 being transferred from semiconductor material (e.g., silicon material) of the semiconductor device 204 to semiconductor material (e.g., silicon material) of the cold plate 206 structure, propagated throughout the semiconductor material of the cold plate 206 structure (shown as dashed lines), and being transferring into coolant fluid flowing through the cold plate 206. A thermal resistance of the first and second heat transfer paths 228A, 228B is illustrated by heat transfer path 228C, which is shown as thermal resistance R1 between a heat source and a cold plate. Here, R1 is the thermal resistance of the bulk semiconductor material of the semiconductor device 204. It can be seen that the heat transfer path 228C of the integrated cooling assembly 203 is reduced compared to the heat transfer path 26 of the device package 10 of FIG. 1, due to the direct bonding discussed above.

In some embodiments, the cold plate 206 may be attached to the semiconductor device 204 using a hybrid bonding technique, where bonds are formed between the dielectric material layers 224A, 224B (see FIG. 2D) and between metal features, such as between first metal pads and second metal pads, disposed in the dielectric material layers 224A, 224B.

Suitable dielectrics that may be used as the dielectric material layers 224A, 224B include silicon oxides, silicon nitrides, silicon oxynitrides, silicon carbon nitrides, metal-oxides, metal-nitrides, silicon carbide, silicon oxycarbides, silicon oxycarbonitride, diamond-like carbon (DLC), or combinations thereof. In some embodiments, one or both of the dielectric material layers 224A, 224B are formed of an inorganic dielectric material, e.g., a dielectric material substantially free of organic polymers. Typically, one or both of the dielectric layers are deposited to a thickness greater than the thickness of a native oxide, such as about 1 nanometer (nm) or more, 5 nm or more, 10 nm or more, 50 nm or more, or 100 nm or more. In some embodiments, one or both of the layers are deposited to a thickness of 3 micrometers or less, 1 micrometer or less, 500 nm or less, such as 100 nm or less, or 50 nm or less. The dielectric layer material and thickness may be optimized for lower thermal resistance between the die and the cold plate.

The cold plate 206 may be formed of any suitable material that has sufficient structural strength to withstand the desired pressures of coolant flowing into the coolant chamber volume 210. For example, the cold plate 206 may be formed of semiconductor material like silicon or other engineered materials like glass. In other examples, the cold plate 206 may be formed of a material selected from a group comprising polymers, metals, ceramics, or composites thereof. In some embodiments, the cold plate 206 may be formed of stainless steel (e.g., from a stainless steel metal sheet) or a sapphire plate.

In some embodiments, the cold plate 206 may be formed of a bulk material having a substantially similar coefficient of linear thermal expansion (CTE) to the bulk material of the substrate 202 and/or the semiconductor device 204, where the CTE is a fractional change in length of the material (in the X-Y plane) per degree of temperature change. In some embodiments, the CTEs of the cold plate 206, the substrate 202, and/or the semiconductor device 204 are matched so that the CTE of the substrate and/or the semiconductor device 204 is within about +/−20% or less of the CTE of the cold plate 206, such as within +/−15% or less, within +/−10% or less, or within about +/−5% or less when measured across a desired temperature range. In some embodiments, the CTEs are matched across a temperature range from about −60° C. to about 100° C. or from about −60° C. to about 175° C. In one example embodiment, the matched CTE materials each include silicon.

In some embodiments, the cold plate 206 may be formed of a material having a substantially different CTE from the semiconductor device 204, e.g., a CTE mismatched material. In such embodiments, the cold plate 206 may be attached to the semiconductor device 204 by a compliant adhesive layer (not shown) or a molding material that absorbs the difference in expansion between the cold plate 206 and the semiconductor device 204 across repeated thermal cycles.

The package cover 208 shown in FIGS. 2C and 3 generally comprises one or more vertical or sloped sidewall portions 208A and a lateral portion 208B that spans and connects the sidewall portions 208A. The sidewall portions 208A may extend upwardly from a peripheral surface of the package substrate 202 to surround the device 204 and the cold plate 206 disposed thereon. The lateral portion 208B may be disposed over the cold plate 206 and is typically spaced apart from the cold plate 206 by a gap corresponding to the thickness of the sealing material layer 222. Coolant is circulated through the coolant chamber volume 210 through the inlet and outlet openings 212 of the package cover 208 formed through the lateral portion 208B. The inlet and outlet openings 206A of the cold plate 206 may be in fluid communication with the inlet and outlet openings 212 of the package cover 208 through the inlet and outlet openings 222A formed in the sealing material layer 222 disposed therebetween. In certain embodiments, coolant lines 108 (FIGS. 2A-2B) may be attached to the device package 201 by use of connector features formed in the package cover 208, such as threads formed in the sidewalls of the inlet and outlet openings 212 of the package cover 208 and/or protruding features 214 that surround the inlet and outlet openings 212 and extend upwardly from a surface of the lateral portion 208B.

Typically, the package cover 208 is formed of semi-rigid or rigid material so that at least a portion of the downward force exerted on the package cover 208 by the mounting frame is transferred to a supporting surface of the package substrate 202 and not transferred to the cold plate 206 and the semiconductor device 204 therebelow. In some embodiments, the package cover 208 is formed of a thermally conductive metal, such as aluminum or copper. In such embodiments, the package cover 208 functions as a heat spreader that redistributes heat from one or more electronic components of the semiconductor device 204.

It should be noted that the direction in which the coolant fluid flows through the cold plate 206 may be controlled depending on the relative locations of the inlet and outlet openings. For example, the coolant fluid may flow from left to right in the device package 201 of FIG. 2D when the inlet openings 212, 222A, 206A of the package cover 208, the sealing material layer 222, and the cold plate 206, respectively, are located on the left-hand side of the device package 201 and the outlet openings 212, 222A, 206A of the package cover 208, the sealing material layer 222, and the cold plate 206, respectively, are located on the right-hand side of the device package 201. Alternatively, the coolant fluid may flow from right to left in the device package 201 illustrated in FIG. 2D when the outlet openings 212, 222A, 206A of the package cover 208, the sealing material layer 222, and the cold plate 206 are located on the left-hand side of the device package 201 and the inlet openings 212, 222A, 206A of the package cover 208, the sealing material layer 222, and the cold plate 206 are located on the right-hand side of the device package 201. Although only one set of inlet and outlet openings is shown and described here, additional inlet and outlet openings may also be provided at various locations on the package cover 208, the sealing material layer 222, and the cold plate 206.

An example flow path of the coolant fluid through the coolant chamber volume 210 may be as follows:

1. Coolant fluid enters the coolant chamber volume 210 through the inlet openings.
2. Coolant fluid flows across the inside surfaces of the cold plate 206 and absorbs heat generated by the semiconductor device 204, which has dissipated into the cold plate 206 structure. The coolant fluid may also flow directly across the backside 220 of the semiconductor device 204 to absorb heat energy directly from the semiconductor device 204. The coolant chamber volume 210 may additionally have various channels formed to direct the coolant fluid flow from inlet opening(s) to outlet opening(s) and facilitate heat extraction from the semiconductor device 204 by the coolant fluid. In some embodiments, the coolant fluid may be in direct contact with the backside 220 of the semiconductor device 204 or via one or more substrate or layers between the coolant fluid or backside 220 of the semiconductor device 204.
3. Coolant fluid exits the coolant chamber volume 210 through outlet openings.

It will be understood from the above flow path that heat is extracted without introducing an unnecessary thermal resistance (e.g., a TIM disposed between the backside 220 of the semiconductor device 204 and the cold plate 206) between the backside 220 of the semiconductor device 204 and the cold plate 206.

Figure 2F:
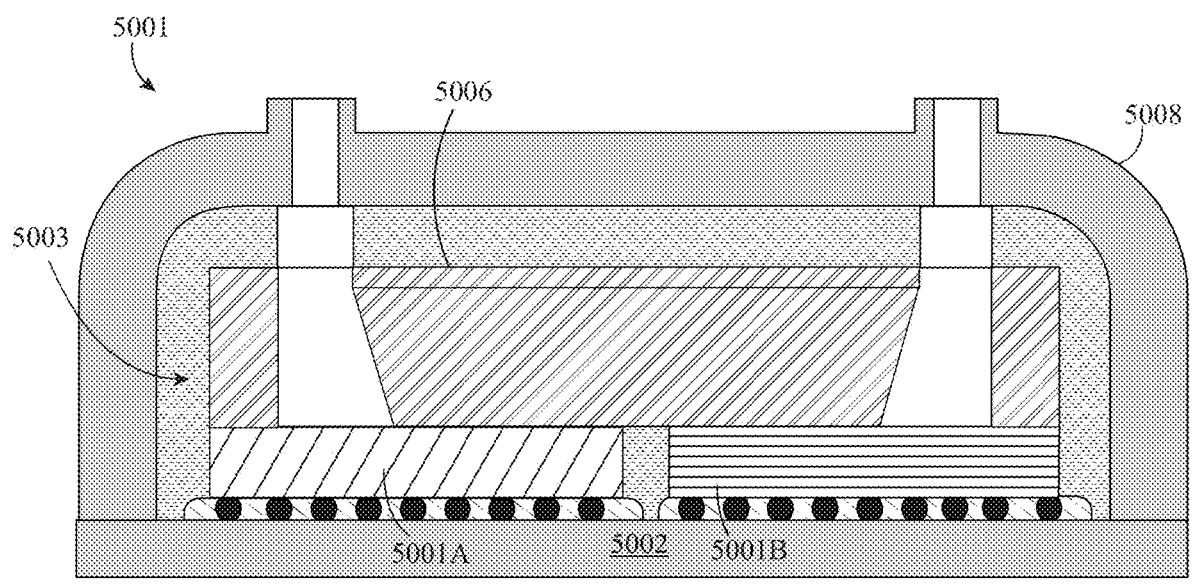
FIG. 2F is a schematic sectional view of another example device package, in accordance with embodiments of the present disclosure, that may be used with the system panel.

FIG. 2F is a schematic side sectional view in the X-Z plane of an example of a multi-component device package 5001 that includes a cold plate 5006 directly bonded to the backside surfaces of two or more devices 5001A, 5001B. The multi-component device package 5001 may be similar to the device package 201 described above, and therefore the description of similar features is omitted for brevity. In some embodiments, the two or more devices 5001A and 5001B are reconstituted and then bonded to the cold plate 5006. As shown, the device package 5001 includes a package substrate 5002, an integrated cooling assembly 5003 and a package cover 5008. The integrated cooling assembly 5003 may include a plurality of devices 5001A (one shown) that may be singulated and/or disposed in a vertical device stack 5001B (one shown). The cold plate 5006 may be attached to each of the devices 5001A and device stack 5001B, e.g., by the direct bonding methods described herein or other methods including flip chip bonding, etc. In some embodiments, the device 5001A may comprise a processor, and the device stack 5001B may comprise a plurality of memory devices. Here, the device 5001A and the device stack 5001B are disposed in a side-by-side arrangement on the package substrate 5002 and are in electrical communication with one another through conductive elements formed in, on, or through the package substrate 5002. Here, the cold plate 5006 is sized to provide a bonding surface for attachment to both the device 5001A and the device stack 5001B but may otherwise be the same or substantially similar to other cold plates described herein. In some embodiments, the lateral dimensions (or footprint) of the cold plate 5006 may be smaller or larger than the combined lateral dimensions (or footprint) of both the device 5001A and the device stack 5001B. In some embodiments, one or more sidewalls of the cold plate 5006 may be aligned or offset to the vertical sidewalls of the device 5001A and the device stack 5001B (including inside or outside their footprint). In some embodiments, more than one cold plate 5006 may be bonded. For example, separate cold plates may be bonded to the device 5001A and the device stack 5001B.

Figure 2G:
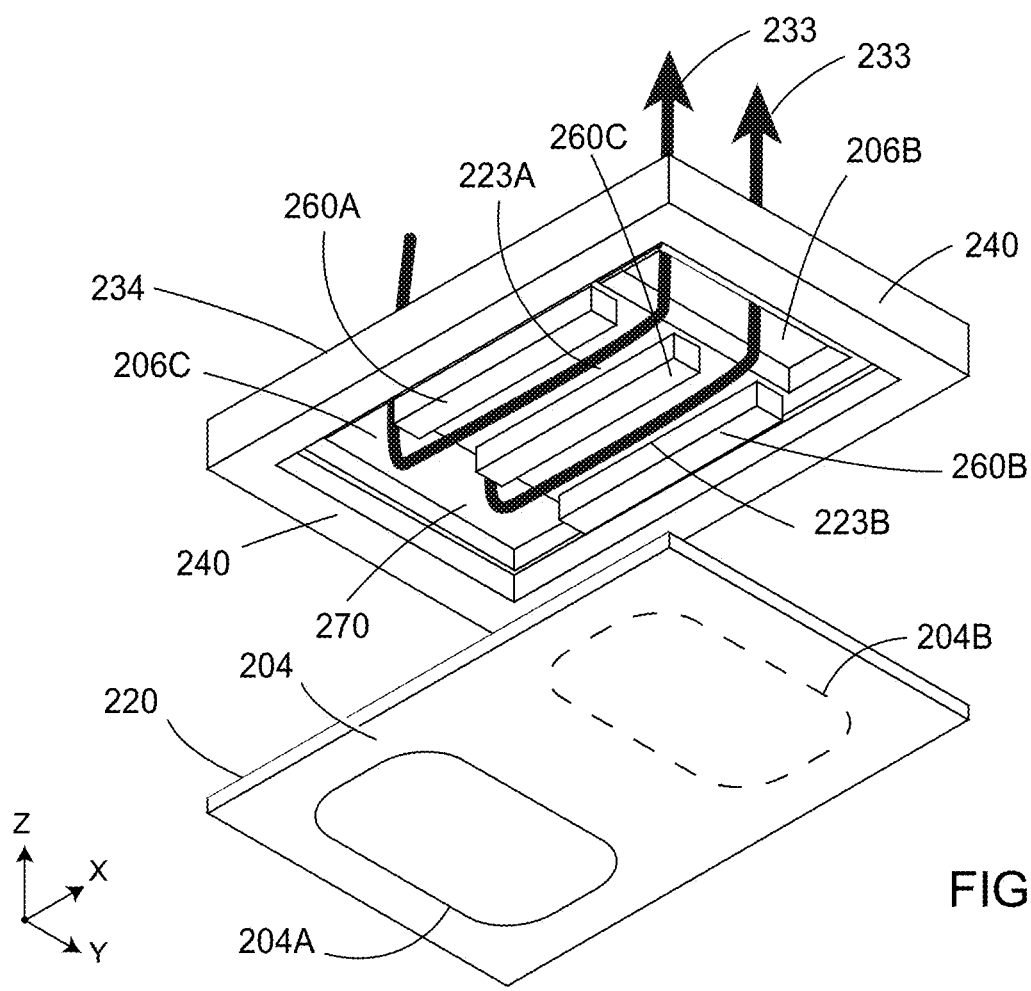
FIG. 2G is a schematic exploded isometric view of an integrated cooling assembly, in accordance with embodiments of the disclosure.

FIG. 2G is a schematic exploded isometric view of the cold plate 206, in accordance with embodiments of the disclosure, the cold plate 206 comprises a top portion 234 and sidewalls 240 extending downwardly from the top portion 234 to a backside 220 of the semiconductor device 204. The top portion 234, the sidewalls 240, and the backside 220 of the semiconductor device 204 collectively define a coolant chamber volume 270 therebetween. Furthermore, the cold plate 206 may comprise dividers 260A, 260B, 260C extending downwardly from the top portion 234 to the backside 220 of the semiconductor device 204. The dividers 260A and 260C may extends laterally and in parallel between an inlet opening 206C of the cold plate 206 and an outlet opening 206B of the cold plate 206 to define a fluid channel 223A therebetween. It will be understood that all references to an opening throughout the present disclosure refer to an opening defined by a sidewall (e.g., opening sidewall). Similarly, the divider 260B may extend laterally between the inlet opening 206C and the outlet opening 206B and, together in parallel with the divider 260C, defines a fluid channel 223B therebetween. It should be appreciated that, although in this exemplary embodiment the cold plate 206 comprise three dividers, in other embodiments the cold plate 206 may comprise one divider and one or more channels may be formed on either side of the divider by means of the divider and the sidewalls 240. More specifically, channels may be formed between a given divider and a sidewall extending parallel to the given divider. Alternatively, in yet other embodiments, the cold plate 206 may comprise more than three dividers, for example four dividers, five dividers or six dividers. In such examples, the cold plate 206 comprises more than two channels, for example three channels, four channels or more, defined between the dividers and/or divider(s) and sidewall(s) 240. Although fluid channel 223 A formed between dividers 260A and 260C and fluid channel 223B formed between dividers 260A and 260B, are shown to be parallel, they may be of zigzag or any other shape between an inlet opening 206C of the cold plate 206 and an outlet opening 206B of the cold plate 206. Although fluid channels 223A and 223B are shown to be parallel, they may intersect in some other embodiments.

The plural fluid channels may extend between a single inlet opening and a single outlet opening of the cold plate 206, such that the plural fluid channels share the same inlet and outlet openings.

In embodiments having plural fluid channels, each fluid channel may be connected between a separate inlet opening and a separate outlet opening. In such embodiments, coolant fluid may be directed to the separate inlet openings and from the separate outlet openings using a manifold disposed above the openings in the Z-axis direction The cold plate 206 is attached to the backside 220 of the device 204 without the use of an intervening adhesive material, e.g., the cold plate 206 may be directly bonded to the backside 220 of the device 204, such that the cold plate 206 and the backside 220 of the device 204 are in direct contact. In some embodiments, the dividers 260A-C comprise lower surfaces extending which are substantially parallel with the device backside 204. Similarly, the sidewalls 240 may comprise lower surfaces which are substantially parallel with the device backside 204. In such examples, the lower surfaces of the dividers 260A-C and the lower surfaces of the sidewalls 240 are in direct contact with the device backside 204. For example, in some embodiments, one or both of the cold plate 206 (e.g., the lower surface of the dividers 260A-C and the lower surfaces of the sidewall 240) and the backside 220 of the semiconductor device 204 may comprise a dielectric material layer, e.g., a first dielectric material layer and a second dielectric material layer respectively, and the cold plate 206 is directly bonded to the backside 220 of the semiconductor device 204 through bonds formed between the dielectric material layers.

Arrows 233 illustrate coolant flow paths 233 corresponding to exemplary embodiments of the present disclosure. That is, the flow paths 233 illustrate a direction in which coolant fluid may flow through the coolant chamber volume 270. It should be noted that the direction of the flow path may be controlled depending on the relative locations of the inlet and outlet openings 206C, 206B on the cold plate 206. Therefore, in some embodiments, the direction of the flow path may be reversed due to the relative locations of the inlet and outlets 206C, 206B being reversed compared to the direction of flow illustrated in FIG. 2G.

An example flow path of fluid through the coolant chamber volume 270 may be as follows:
1. fluid enters the coolant chamber volume 270 through the inlet opening 206C;
2. the fluid flows across the inside surfaces of the cold plate 206 and absorbs heat generated by the semiconductor device 204 which has dissipated into the cold plate 206 structure; and
3. the fluid exits the coolant chamber volume 270 through outlet opening 206B.

The semiconductor device 204 may comprise a hotspot region 204A and an adjacent region 204B. In operation, a power density of the hotspot region 204A is greater than an average power density of the semiconductor device 204. A power density may be defined as an amount of power that is handled per unit area at a particular point or area of the semiconductor device 204. Generally, a higher power density results in a higher generated heat.

The hotspot region 204A may be caused by active circuitry (i.e., transistors) on the active side 218 of the semiconductor device 204 which gives rise to a region of the backside 220 of the device having a higher temperature, such that the hotspot region 204A may be manifested as an area of the backside 220 of the semiconductor device 204 having an increased temperature as compared to most parts of the semiconductor device. Therefore, in some embodiments, the hotspot region 204A may be taken to mean a region of the active side 218 of the semiconductor device 204. As described herein, in some embodiments a particular portion of the cold plate 206 is aligned with the region of the backside 220 of the semiconductor device 204 which exhibits an increased temperature as compared to the rest of the backside 220 of the semiconductor device which corresponds to the hotspot region 204A.

An adjacent region 204B may be any region of the backside 220 of the semiconductor device 204 which is not determined to be a hotspot region 204A. A hotspot may be taken to mean an amount of heat energy passing through a certain surface which exceeds a threshold. Alternatively, a hotspot may be taken to mean a portion of a surface having a measurable temperature which exceeds a threshold. The heat energy may be measured as heat flux (or thermal flux) using thermal analysis methods such as microthermography. Here, a hotspot region 204A may be taken to mean a region of the backside 220 (i.e. surface) of the semiconductor device 204 at which an amount of heat energy is measured to exceed a threshold. The threshold may be relative to an amount of heat energy passing through the adjacent region 204B. For example, a region of the backside 220 may be determined to be a hotspot region 204A if the amount of thermal flux measured at that region exceeds the amount of thermal flux measured at an adjacent region 204B. Alternatively, a hotspot region 204A may be determined as any region of the backside 220 which exceeds a threshold temperature (e.g., 60 degrees Celsius, 75 degrees Celsius or 90 degrees Celsius).

It will be understood that a hotspot region may not be defined by a single uniform temperature measured within a predefined perimeter. A hotspot region may comprise a hottest portion (e.g., central portion) at which a measured temperature is highest and contours of temperatures surrounding the central portion. For example, a temperature gradient of the hotspot region may be highest in the central portion and gradually reduce towards edges of the hotspot region. Furthermore, a hotspot region may not have a fixed perimeter and edges of a hotspot region may not be defined by a regular shape. That is, as the thermal flux generated by a hotspot region fluctuates, the hotspot region may grow and reduce is size and shape. Therefore, a hotspot region may be any shape having a hottest portion (e.g., central portion) with a temperature that exceeds a threshold, as discussed above. A hotspot region may be a collection of several localized hotspot regions (for example, several hotpot regions may be scattered around and/or be in the vicinity of one another).

The hotspot region 204A may be a region exposed to higher thermal energy relative to at least one other region of the device 204, for example the adjacent region 204B. The hotspot region 204A may have an associated first temperature when the device 204 is in use and the adjacent region 204B may have an associated second temperature when the device 204 is in use. The first temperature may be higher than the second temperature. For example, the first temperature may be 70 degrees Celsius and the second temperature may be 45 degrees Celsius. It will be understood that the difference between the first and second temperatures may vary according to the operating conditions and the types of components operating in the different regions.

The heat energy passing through and/or measured at the backside 220 may be generated by components of the semiconductor device 204. That is, electronic components may be positioned adjacent to the backside 220 within the semiconductor device 204 such that heat energy generated by the electronic components dissipates into and/or through the structure of the backside 220 as the electronic components function. For example, the hotspot region 204A may comprise one or more electronic components with a relatively high power dissipation rate, such as a processing units like computational core, neural core or graphical processing unit. In such embodiments, the inlet opening of the cold plate may be disposed over (i.e. overlap) or slightly offset from the processing unit (e.g., processing core region, CPU, GPU, NPU, etc.) of a semiconductor device to which the cold plate is attached. Such core regions may generally have higher power and thermal density than the adjacent regions of a semiconductor device.

On the other hand, the adjacent region 204B may comprise one or more electronic components with a relatively low power dissipation rate, such as a memory unit, I/O unit, PHY unit, SERDEDES block or analog unit. In other examples, the adjacent region 204B may comprise no electronic component therein. In some examples, memory units (e.g. cache, SRAM) may also be considered to be hotspot region.

The inlet opening 206C may be disposed over (i.e. at least partially overlaps) the hotspot region 204A and the outlet opening 206B may be disposed over (i.e. at least partially overlaps) the adjacent region 204B. It should be noted that, in some embodiments, the inlet opening 206C and the outlet opening 206B may fully overlap (and align with) their respective regions. In some embodiments, the inlet opening 206C and the outlet opening 206B may overlap (and align with) their respective regions with an offset. Such an arrangement ensures that coolant fluid initially flows across the hotspot region 204A before proceeding to flow across the adjacent region 204B, and therefore a temperature of the coolant fluid is lowest when encountering the hotspot region 204A. Advantageously, this arrangement maximises the transfer of thermal energy from the hotspot region 204A to the coolant fluid, which improves the overall efficiency of the integrated cooling assembly 203. Subsequently, the coolant fluid flows to the adjacent region 204B (e.g., through fluid channels 223A and/or 223B) which has a lower temperature than the hotspot region 204A. The adjacent region 204B may transfer additional thermal energy to the fluid prior to the fluid exiting the coolant chamber volume 270 through the outlet opening 206B.

It will be understood that the location of the hotspot region 204A may be any region of the semiconductor device 204, and therefore the location of the inlet opening 206C and the outlet opening 206B may be adjusted accordingly. Furthermore, the locations of the inlet opening 212 and the outlet opening 212 in the package cover 208 may be adjusted to be above the locations of the inlet opening 206C and the outlet opening 206B of the cold plate 206, respectively. Similarly, the sealing material layer 222 may be adapted such that the inlet and outlet opening 206C, 206B may be in fluid communication with the inlet and outlet openings 212 of the package cover 208 through openings formed in the sealing material layer 222 disposed therebetween. For example, in embodiments where the hotspot region 204A is a central portion of the semiconductor device 204, the inlet opening 206C of the cold plate 206 and the inlet opening 212 of the package cover 208 may be repositioned to a location substantially above the central portion of the semiconductor device 204, where the hotspot region 204A is located.

Certain embodiments of the present disclosure will now be described in relation to FIGS. 3-5, in which plural inlet openings 206C and/or plural outlet openings 206B may be provided in cold plates, as described in the following embodiments. It will be understood that the package cover 208 includes the same number of inlet openings 212 as a cold plate, and the package cover 208 includes the same number of outlet openings 212 as a cold plate. Furthermore, where a location of cold plate openings is adjusted due to the number of cold plate opening provided, a location of the openings in the package cover 208 (and the sealing material layer 222) are adjusted accordingly.

FIG. 3 is a bottom view of a cold plate 306 according to an embodiment of the present discourse. The cold plate 306 comprises an inlet opening 306A, a first outlet opening 306B and a second outlet opening 306C. The inlet opening 306A is in a central region of the cold plate 306 and the first and second outlet openings 306B and 306C are located on either sides of the inlet opening 306A, respectively. The cold plate 306 may further comprise a plurality of first dividers 360A extending laterally between the inlet opening 306A and the outlet opening 306B and spaced apart to define a plurality of first fluid channels 323A therebetween. Similarly, the cold plate 306 may further comprise a plurality of second dividers 360C extending laterally between the inlet opening 306A and the outlet opening 306C and spaced apart to define a plurality of second fluid channels 323B therebetween. In embodiments illustrated by FIG. 3, the first dividers 360A comprise five dividers which are in parallel and spaced apart to define four fluid channels. A further two fluid channels are defined between the outermost first dividers 360A and adjacent sidewalls of the cold plate 306. Similarly, the second dividers 360C comprise five dividers which are in parallel and spaced apart to define four fluid channels. A further two fluid channels are defined between the outermost second dividers 360C and adjacent sidewalls of the cold plate 306. It is understood that any number of first or second dividers (including no dividers) as well as fluid channels may be provided. It should also be understood that the number, size and shape (including length and width) of the first dividers may be the same or different from the number, size and shape of the second dividers. It should be understood that the size and shape of the channels (including length and width) may also be different from one another. Furthermore, the lateral separation between the inlet opening 306A and the first outlet opening 306B may be the same or shorter than the outlet opening 306B. In some embodiments, one or more outlet openings 306B and 306C may be on the same side of inlet opening 306A. Although FIG. 3 depicts one large centrally located inlet opening 306A, two or more inlet openings (similar or dissimilar in size and shape) may also be provided.

Although not shown, the inlet opening 306A may be disposed over (i.e. overlap) a hotspot region of a semiconductor device to which the cold plate 306 is attached. In some embodiments, the inlet opening 306A may be disposed laterally offset from (i.e. at least partially overlap) a hotspot region of a semiconductor device to which the cold plate 306 is attached. The first and second outlet openings 306B, 306C may be disposed over (i.e., overlap or may be laterally offset from) first and second adjacent regions, respectively. In some embodiments, at least one of the outlet openings 306B, 306C may be disposed over another hotspot region of a semiconductor device. In some other embodiments, the inlet opening 306A may be disposed over (i.e. overlap) or slightly offset from the processing core region (e.g. CPU, GPU, NPU, etc.) of a semiconductor device to which the cold plate 306 is attached. Such core regions may generally have higher power and thermal density than the adjacent regions of a semiconductor device.

In FIG. 3, a cross-sectional dimension of the inlet opening 306A is greater than a cross sectional dimension of the outlet openings 306B, 306C. Here, cross-sections of the openings are rectangular and the cross-sectional dimensions comprises an opening length in the Z-axis direction and an opening width in the X-axis direction. In other embodiments, the cross-sections may be circular, square, hexagonal or elliptical, for example, and the cross-sectional dimensions may comprise a radius. It will be understood that, although in FIG. 3 the inlet opening 306A and the outlet openings 306C and 306B are shown as having different cross-sectional dimensions, this is non-limiting and exemplary. In other embodiments, the inlet opening 306A and the outlet openings 306C and 306B may comprise the same cross-sectional dimension. In yet another embodiments, the cross-sectional dimensions of each opening may be determined based on a power dissipation rate of a region over which each opening is disposed over (i.e. overlapping) and/or a requirement of a fluid flow in either direction. Power dissipated by electronic components of the semiconductor device 204 may be determined empirically or quantitatively. A power dissipation rate of electronic components at a hotspot region of the backside 220 and at an adjacent region of the backside 220 may then be determined. The cross-sectional dimension of the inlet opening 306A may be determined to be proportional to the power dissipation rate associated with the hotspot region, and the cross-sectional dimension of the outlet opening(s) 306C, 306B may be determined to be proportional to the power dissipation rate associated with the adjacent region. Since the hotspot region inherently has a higher associated power dissipation rate than an adjacent region, in such embodiments, the inlet opening 306A has a greater cross-section dimension than a cross-sectional dimension the outlet opening(s) 306C, 306B. As discussed above, the inlet opening of the cold plate may be disposed over (i.e. overlap) or slightly offset from the processing core region (e.g. CPU, GPU, NPU, etc.) of a semiconductor device to which the cold plate is attached. Such core regions may generally have higher power and thermal density than the adjacent regions of a semiconductor device.

FIG. 4 is a bottom view of a cold plate 406 according to an embodiment of the present disclosure, which may be attached to a semiconductor device. The cold plate 406 comprises an outlet opening 406C, a first inlet opening 406A and a second inlet opening 406B. The outlet opening 406C is in a central region of the cold plate 406 and the first and second inlet openings 406A and 406B are located on either sides of the outlet opening 406C, respectively. The cold plate 406 may further comprise a plurality of first dividers 460A extending laterally between the second inlet opening 406B and the outlet opening 406C and spaced apart to define a plurality of first fluid channels 423A therebetween. Similarly, the cold plate 406 may further comprise a plurality of second dividers 460C extending laterally between the first inlet opening 406A and the outlet opening 406C and spaced apart to define a plurality of second fluid channels 423B therebetween. Although not shown, in this embodiment the first and second inlet openings 406A, 406B may overlap first and second hotspot regions of a semiconductor device, respectively. Such an arrangement of inlet and outlet openings may be particularly useful when the cold plate 406 is attached to a semiconductor device having hotspot regions on the sides thereof and a cooler region relative to the hotspots in a central portion of the semiconductor device 204. It should be appreciated that in another embodiment, the location of the inlet and outlet openings may be reversed, as discussed above in relation to the cold plate 306 of FIG. 3. It is understood that any number of first or second dividers (including no dividers) as well as fluid channels may be provided. It should also be understood that the number, size and shape (including length and width) of the first dividers can be the same or different from the number, size and shape of the second dividers. It should be understood that the size and shape (including length and width) of the channels may also be different from one another. Although FIG. 4 depicts one large centrally located outlet opening 406C, two or more outlet openings (similar or dissimilar in size and shape) may also be provided.

Although not shown, in this embodiment the first and second inlet openings 406A, 406B may be disposed over (i.e. overlap) a first hotspot region and a second hotspot region, respectively. In some embodiments, the inlet opening may be disposed laterally offset from (i.e. overlap) a hotspot region of a semiconductor device to which the cold plate 306 is attached. The outlet region 406C may be disposed (i.e., overlap) an adjacent region. The first and second hotspot regions may both be regions exposed to higher thermal energy relative to the adjacent region. For example, when the semiconductor device is in use, the first hotspot region may have an associated first temperature, the adjacent region may have an associated second temperature, and the second hotspot region may have an associated third temperature. The relative temperatures between the three regions may be such that the first and third temperatures are greater than the second temperatures.

In embodiments illustrated by FIG. 4, coolant fluid may flow across both the first and second hotspot regions before proceeding to flow across the adjacent region, and therefore a temperature of the coolant fluid is lower when encountering the first and second hotspot regions. Advantageously, this arrangement maximises the transfer of thermal energy from two different hotspot region to the coolant fluid, which further improves the overall efficiency of the integrated cooling assembly 203. In particular, by providing focused cooling at regions of the backside 220 which are prone to thermal spikes, the temperature difference across the semiconductor device 204 is reduced (e.g., the device temperature becomes more uniform across the backside 220). Furthermore, by providing plural inlet openings, a pressure of the fluid flowing through the coolant chamber volume is reduced, which reduced mechanical stress.

Here, the first inlet opening 406A has a different cross-sectional dimension to that of the second inlet opening 406B. That is, the cross-section dimension of the second inlet opening 406B is greater than the cross-section dimension of the first inlet opening 406A. In this manner, a volume of fluid entering the second inlet opening 406B may be greater than a volume of fluid entering the second inlet opening 406A. Such embodiments may provide an increased rate of cooling at the second hotspot region compared to the first hotspot region due to the greater volume of fluid flowing through the second inlet region 406B compared to the first inlet region 406A. Advantageously, the increased rate of coolant may be provided at the hotspot region which is exposed to the highest amount of thermal energy from among the first and second hotspot regions. As discussed above, the inlet opening of the cold plate may be disposed over (i.e. overlap) or slightly offset from the processing core region (e.g. CPU, GPU, NPU, etc.) of a semiconductor device to which the cold plate is attached. Such core regions may generally have higher power and thermal density than the adjacent regions of a semiconductor device.

FIG. 5 is a bottom view of a cold plate 506 according to an embodiment of the present disclosure. The cold plate 506 comprises an inlet opening 506A, a first outlet opening 506B, a second outlet opening 506C, a third outlet opening 506D and a fourth outlet opening 506E. The inlet opening 506A is located in a central region of the cold plate 506 and the first, second, third and fourth outlet openings 506B, 506C, 506D and 506E are positioned symmetrically with respect to an axis perpendicular to and in a plane of the central region. For example, in FIG. 5, the central region may be defined as a rectangular region which has a length in the Z-axis direction which is greater than a width in the X-axis direction and which comprises at least the inlet opening 506A. The axis perpendicular to and in a plane of the central region may be perpendicular to the Z-axis and may be in the same plane as the inlet opening 506A. The cold plate 506 may further comprise a plurality of dividers 560A and 560B extending between the inlet opening 506A and the outlet openings 506B, 506C, 506D and 506E and spaced apart to define a plurality of fluid channels therebetween. Although not shown, in this embodiment the inlet opening 506A may be disposed over a hotspot region of a semiconductor device to which the cold plate 506 is attached. It should be appreciated that in other embodiments, the location of the inlet and outlet openings may be reversed. This means that the inlet opening 506A may be an outlet opening and the outlet openings 506B, 506C, 506D and 506E may be inlet openings. Such arrangements of inlet and outlet openings may be useful when the cold plate 306 is attached to a semiconductor device having hotspots on the sides thereof and a cooler region relative to the hotspots in the central portion overlapping the opening 506A. In some embodiments, the location of a part of the openings may be reversed (e.g. openings 506A and 506B may be inlet openings, and openings 506C, 506D and 506E may be outlet openings or openings 506A and 506B may be outlet openings, and openings 506C, 506D and 506E may be inlet openings). It is understood that any number of first or second dividers (including no dividers) as well as fluid channels may be provided. It should also understood that the number, size and shape (including length and width) of the first dividers can be the same or different from the number, size and shape of the second dividers. It should be understood that the size and shape (including length and width) of the channels may also be different from one another.

It should be noted that the arrangement and location of inlet and outlet openings in any one of the embodiments disclosed herein is exemplary and non-limiting. In some embodiments, the position of at least one inlet opening is determined based on a hotspot region of the semiconductor device. For examples, when the semiconductor device comprises three hotspot regions, the cold plate may also comprise at least three inlet opening each of which is disposed over a respective hotspot region of the semiconductor device. In some embodiments, all the inlet openings may be disposed laterally offset from (i.e. overlap) corresponding hotspot regions of a semiconductor device to which the cold plate is attached.

Figure 6:
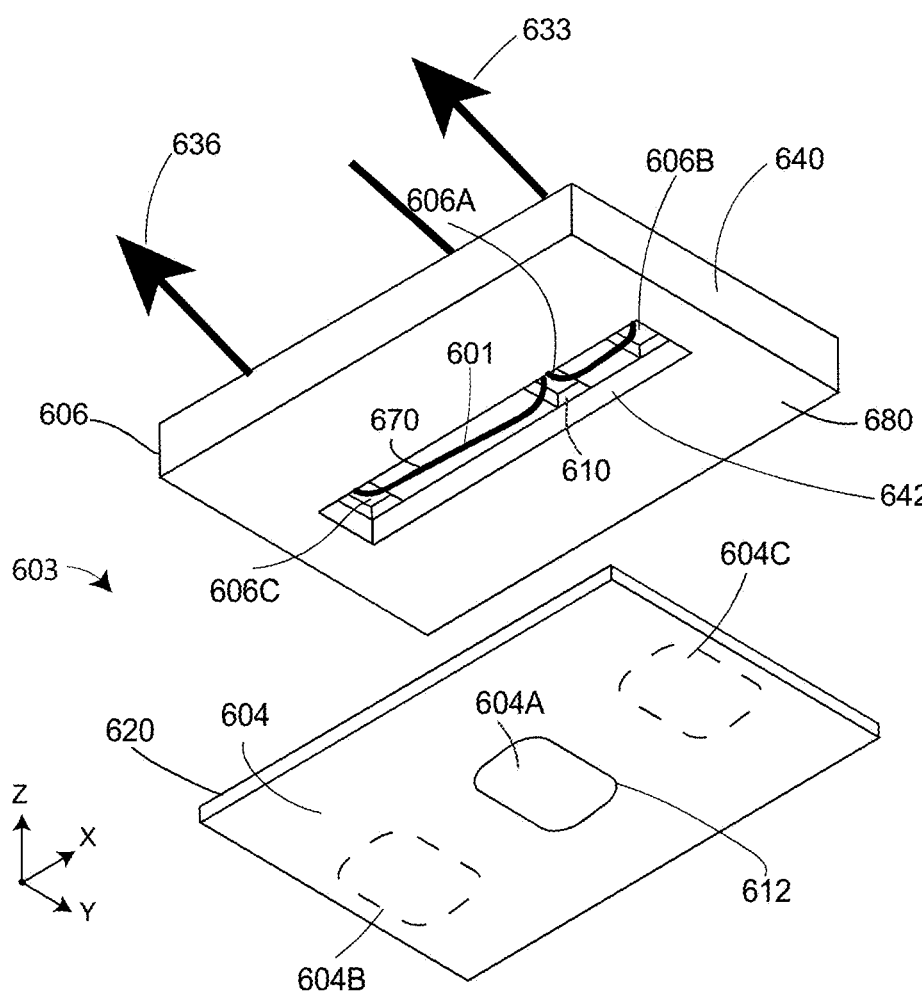
FIG. 6 is a schematic exploded isometric view of an integrated cooling assembly, in accordance with embodiments of the disclosure.

FIG. 6 is a schematic exploded isometric view of an example integrated cooling assembly 603, in accordance with embodiments of the disclosure. As discussed above in relation to the integrated cooling assembly 203, the integrated cooling assembly 603 may be disposed on the package substrate 202, and a package cover 208 may be disposed on a peripheral portion of the package substrate 202 to form a device package. The package cover 208 may extend over the integrated cooling assembly 603 so that the integrated cooling assembly 603 is disposed between the package substrate 202 and the package cover 208.

As illustrated in FIG. 6, the integrated cooling assembly 603 typically includes a semiconductor device, here device 604, and a cold plate 606 bonded to the device 604. As discussed above in relation to the integrated cooling assembly 203, the semiconductor device 604 includes an active side (not shown) that includes device components, e.g., transistors, resistors, and capacitors, formed thereon or therein, and a non-active side, here the semiconductor device backside 620, opposite the active side.

The cold plate 606 comprises a base surface 601 and cavity sidewalls 642 extending downwardly from the base surface 601 to the backside 620 of the semiconductor device 604. Here, the base surface 601 faces the backside 620 of the semiconductor device 604 and an external surface of the cold plate 606, opposite the base surface 601, faces the package cover 208. The base surface 601, the cavity sidewalls 642, and the backside 620 of the semiconductor device 604 collectively define a coolant channel 670 therebetween. In FIG. 6, the cavity sidewalls 642 comprise two pairs of opposing sidewall to form a rectangular shaped cavity (e.g., coolant channel 670) within the cold plate 606. A first pair of opposing sidewalls is orthogonal to a second pair of opposing sidewalls to form the rectangular coolant channel 670. The first pair of opposing sidewalls define a length of the coolant channel 670 in the X-axis direction and the second pair of opposing sidewalls define a width of the coolant channel 670 in the Y-axis direction. The cold plate 606 further includes external sidewalls 640 which are external to the coolant channel 670 and define a perimeter of the cold plate 606. Here, portions of the cold plate 606 between the external sidewalls 640 and the cavity sidewalls 642 extend downwardly and between the respective sidewalls to define a lower surface 680 of the cold plate 606. A thickness of the external sidewalls 640 in the Z-axis direction defines a thickness of the cold plate 606. A thickness of the cavity sidewalls 642 in the Z-axis directions defines a depth of the coolant channel 670. As shown, a thickness of the cavity sidewalls 642 is less than a thickness of the external sidewalls 640 in order that the coolant channel 670 does not extend entirely through the cold plate 606.

As with the cold plate 206 of FIG. 2G, the cold plate 606 is attached to the backside 620 of the semiconductor device 604 without the use of an intervening adhesive material, e.g., the cold plate 606 may be directly bonded to the backside 620 of the device 604, such that the cold plate 606 and the backside 620 of the device 604 are in direct contact. In some embodiments, the lower surface 680 of the cold plate 606 is in direct contact with the device backside 620. For example, in some embodiments, one or both of the cold plate 606 (e.g., the lower surface 680 of the cold plate 606) and the backside 620 of the semiconductor device 604 may comprise a dielectric material layer, e.g., a first dielectric material layer and a second dielectric material layer respectively, and the cold plate 606 is directly bonded to the backside 620 of the semiconductor device 604 through bonds formed between the dielectric material layers. Here, the first dielectric material layer may be disposed on the lower surface 680 of the cold plate 606.

In some embodiments, the cold plate 606 may be attached to the semiconductor device 204 using a hybrid bonding technique, where bonds are formed between the dielectric material layers and between metal features, such as between first metal pads and second metal pads, disposed in the dielectric material layers.

The cold plate 606 further comprises an inlet opening 606A, a first outlet opening 606B, and a second outlet opening 606C. The inlet opening 606A is disposed between the first outlet opening 606B and the second outlet opening 606C. The inlet opening 606A, the first outlet opening 606B and the second outlet opening 606C are in fluid communication with the coolant channel 670. As shown, the coolant channel 670 is rectangular in shape such that coolant fluid can flow between the opening along a length of the coolant channel 670. With reference to FIG. 6, the semiconductor device 604 may comprise a hotspot region 604A and adjacent regions 604B, 604C. The adjacent regions 604B, 604C may be any region of the backside 620 of the semiconductor device 604 which is not determined to be a hotspot region 604A. A hotspot region is taken to have the same meaning as the hotspot region 204A discussed above in relation to FIG. 2G.

In contrast to the inlet opening 206C according to embodiments discussed above, the inlet opening 606A is laterally offset from the hotspot region 604A of the semiconductor device 604. The inlet opening 606A may be laterally offset from the hotspot region 604A such that only a portion of the inlet opening 606A overlaps the hotspot region in the X-Y plane or the inlet opening 606A only overlaps only a subset of the hotspot region in the X-Y plane. For example, the inlet opening 606A and the hotspot region 604A may be fully aligned when they share a common central axis in the Z-axis direction. The inlet opening 606A and the hotspot region 604A may by misaligned when they do not share the same central axis in the Z-axis direction. Therefore, a laterally offset inlet opening 606A is taken to mean that a central axis of the inlet opening 606A is different than a central axis of the hotspot region 604A, in the Z-axis direction.

In some embodiments, a horizontal distance (in the X-axis direction) between an opening sidewall 610 defining the inlet opening 606A and a periphery 612 of the hotspot region 604A is less than or equal to 1 millimeter (mm), less than or equal to 5 mm or less than or equal to 10 mm. All portions of the opening sidewall 610 may be horizontally spaced apart from the perimeter 612 in order that all portions of the inlet opening 606A are horizontally spaced apart from the perimeter 612 by 1 mm or less (or <5 mm or <10 mm) (e.g., the entire opening sidewall 610 is spaced apart from the entire hotspot region 604A by 1 mm or less). In some embodiments, all portions of the opening sidewall 610 may be horizontally spaced apart from the perimeter 612 in order that all portions of the inlet opening 606A are horizontally spaced apart from the perimeter 612 by a distance between and including 0.1 mm and 1 mm. In some embodiments, a portion of the opening sidewall 610 closest to the hotspot region 604A is spaced away from the closest portion of the hotspot region 604A in the X-axis direction by a distance of 1 mm or less, such that no portion of the inlet opening 606A overlaps the hotspot region 604A. In some embodiments, a distance between the opening sidewall 610 and the perimeter 612 of the hotspot region 604A may be greater than 1 mm (e.g., 2 mm, 5 mm, 10 mm, etc.) to increase a distance coolant fluid must flow between the inlet opening 606A and the hotspot region 604A. The perimeter 612 of the hotspot region 604A may be defined at a border between the hotspot region 604A and an adjacent region 604B, 604C at which a difference in thermal flux measured at either side of the border is greater than a predetermined threshold. Alternatively, the perimeter 612 of the hotspot region 604A may be defined as following a perimeter of the component or components or functional blocks within the semiconductor device 604 which generate the thermal flux creating the hotspot region 604A (e.g. compute core, graphics processing unit, neural engine or neural processing unit, etc.).

In embodiments where the hotspot region 604A is a central portion of the semiconductor device 604 (i.e., the hotspot region 604A is roughly equidistant from all four edges of the semiconductor device 604), the lateral offset of the inlet opening 606A is created by forming the opening in the cold plate 606 such that a distance between the inlet opening 606A and the first outlet opening 606B is less than a distance between the inlet opening 606A and the second opening 606B.

The first outlet opening 606B and the second outlet opening 606C may be disposed over (i.e. at least partially overlap) different adjacent regions 604B, 604C at opposite ends of the coolant channel 670. It should be noted that, in some embodiments, the first outlet opening 606B and the second outlet opening 606C may fully overlap (and align with) their respective regions. Beneficially, laterally offsetting the inlet opening 606A from the hotspot region 604A prevents stagnation of coolant fluid at and/or near to the hotspot region 604A. That is, by introducing coolant fluid into the coolant channel 670 at a location laterally offset from the hotspot region 604A, the coolant fluid must travel a distance between the inlet opening 606A and the hotspot region 604A. By the time the coolant fluid reaches the hotspot region 604A, a flow rate of the coolant fluid has increased to a consisted flow rate, which prevents stagnation of the coolant fluid at the hotspot region 604A. Advantageously, this arrangement increases the transfer of thermal energy from the hotspot region 604A to the coolant fluid, which improves the overall efficiency of the integrated cooling assembly 603. Subsequently, the coolant fluid flows to the adjacent regions 604B, 604C which have a lower temperature than the hotspot region 604A. The adjacent regions 604B, 604C may transfer additional thermal energy to the fluid prior to the fluid exiting the coolant channel 670 through the first and second outlet opening 606B. A further advantage is provided by forming the inlet opening between outlet openings, which reduces the flow path of the coolant fluid, and therefore minimises heat accumulation within the coolant fluid. Providing a reduced flow path also reduces an amount of pressure required to distribute the coolant fluid through the coolant channel.

In FIG. 6, first and second arrows 633, 636 illustrate coolant flow paths corresponding to exemplary embodiments of the present disclosure. The flow paths illustrate directions in which coolant fluid may flow through the coolant channel 670. As shown, the coolant fluid enters the coolant channel 670 through a single inlet opening 606A and exits the coolant channel 670 through first and second outlet openings 606B, 606C disposed at opposite ends of the coolant channel 670. A first portion of the coolant fluid flows in a first direction towards the first outlet opening 606B, as illustrated by arrow 633, and a second portion of the coolant fluid flows in a second direction towards the second outlet opening 606C, as illustrated by arrow 636.

An example flow path of coolant fluid through the coolant channel 670 may be as follows:

1. fluid enters the coolant channel 670 through the inlet opening 606A;
2. the coolant fluid flows across the inside surfaces of the coolant channel 670 and absorbs heat generated by the semiconductor device 604 which has dissipated into the cold plate 606 structure; and
3. the coolant fluid exits the coolant channel 670 through the first and second outlet openings 606B, 607C.

It will be understood that coolant fluid may be circulated through the coolant channel 670 through the package cover inlet/outlet openings 212 formed through the lateral portion 208B. The inlet and outlet opening of the cold plate 606 may be in fluid communication with the inlet and outlet openings of the package cover 208 through openings formed in the sealing material layer disposed therebetween.

FIG. 7 is a bottom view of a cold plate 706 in the X-Y plane according to embodiments illustrated by FIG. 6 (i.e., whereby the inlet opening 606A is laterally offset from the hotspot region 604A). The cold plate 706 of FIG. 7 comprises pairs of cavity sidewalls each collectively define a separate coolant channel with the base surface and the backside of the semiconductor device. Each separate coolant channel is in fluid communication with a respective inlet opening and respective first and second outlet openings, and each inlet opening is disposed between its respective first and second outlet openings. Each inlet opening is laterally offset from the hotspot region of the semiconductor device. Each pair of cavity sidewalls extends in parallel between their respective inlet opening and respective first and second outlet openings.

Here, a first inlet opening 706A, a first outlet opening 706B, and a second outlet opening 706C are fluidly connected to a first coolant channel 770A. The first coolant channel 770A is defined by a first pair of parallel cavity sidewalls which extend between the first inlet opening 706A and the first and second outlet openings 706B, 706C (with the inlet opening 706A disposed between the outlet openings 706B, 706C). A distance between the first inlet opening 706A and the first outlet opening 706B is less than a distance between the first inlet opening and the second outlet opening 706C, such that the first inlet opening 706A is laterally offset from a hotspot region disposed centrally on an underlying semiconductor device. The first coolant channel 770A extends laterally along the backside of the underlying semiconductor device in the Y-axis direction.

The cold plate 706 further comprises a second inlet opening 707A, a third outlet opening 707B, and a fourth outlet opening 707C fluidly connected to a second coolant channel 770B. The second coolant channel 770B is defined by a second pair of parallel cavity sidewalls which extend between the second inlet opening 707A and the third and fourth outlet openings 707B, 707C (with the inlet opening 707A disposed between the outlet openings 707B, 707C). A distance between the second inlet opening 707A and the third outlet opening 706B is less than a distance between the second inlet opening 707A and the fourth outlet opening 707C, such that the second inlet opening 707A is laterally offset from a hotspot region disposed centrally on an underlying semiconductor device. The second coolant channel 770B extends laterally along the backside of the underlying semiconductor device in the X-axis direction. Therefore, an angle formed between the first pair of parallel cavity sidewalls and the second pair of parallel cavity sidewalls is substantially 90 degrees (°). Similarly, an angle formed between the first coolant channel 770A and the second coolant channel 770B is substantially 90°.

Beneficially, by providing two separate coolant channels each having an laterally offset inlet opening disposed between different respective outlet openings, the rate of transfer of thermal energy from a hotspot region to a coolant fluid is further increased, which further improves the overall efficiency of the integrated cooling assembly. It should be understood that, in some embodiments, the size and shape (including length and width) of the channels may be different from one another.

Figure 8:
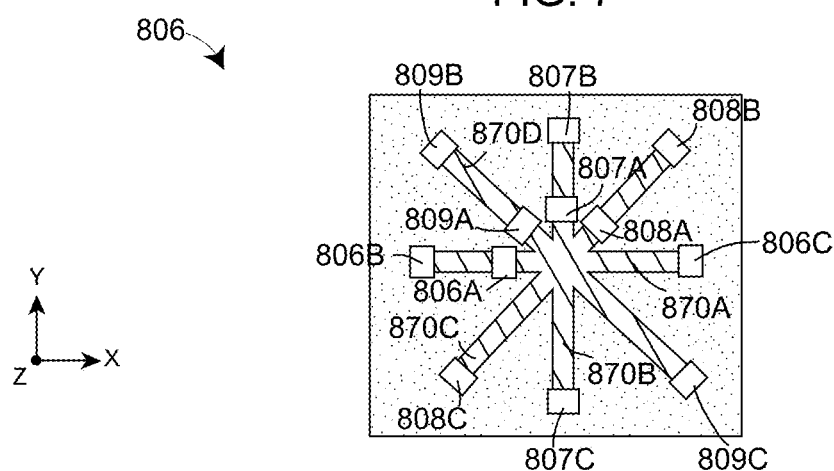
FIG. 8 is schematic of a cold plate, in accordance with one or more embodiments.

FIG. 8 is a bottom view of a cold plate 806 in the X-Y plane according to embodiments illustrated by FIG. 6 (i.e., whereby an inlet opening is laterally offset from a hotspot region). The cold plate 806 of FIG. 8 comprises four different coolant channel. An angle between adjacent pairs of cavity sidewalls of the four coolant channels is substantially 45°. Similarly, an angle formed between adjacent coolant channels is substantially 45°.

Here, a first inlet opening 806A, a first outlet opening 806B, and a second outlet opening 806C are fluidly connected to a first coolant channel 870A. The first coolant channel 870A is defined by a first pair of parallel cavity sidewalls which extend between the first inlet opening 806A and the first and second outlet openings 806B, 806C (with the inlet opening 806A disposed between the outlet openings 806B,806C). A distance between the first inlet opening 806A and the first outlet opening 806B is less than a distance between the first inlet opening and the second outlet opening 806C, such that the first inlet opening 806A is laterally offset from a hotspot region disposed centrally on an underlying semiconductor device. The first coolant channel 870A extends laterally along the backside of the underlying semiconductor device in the X-axis direction.

The cold plate 706 further comprises a second inlet opening 807A, a third outlet opening 807B, and a fourth outlet opening 807C fluidly connected to a second coolant channel 870B. The second coolant channel 870B is defined by a second pair of parallel cavity sidewalls which extend between the second inlet opening 807A and the third and fourth outlet openings 807B, 807C (with the inlet opening 807A disposed between the outlet openings 807B,807C). A distance between the second inlet opening 807A and the third outlet opening 806B is less than a distance between the second inlet opening 807A and the second outlet opening 807C, such that the second inlet opening 807A is laterally offset from a hotspot region disposed centrally on an underlying semiconductor device. The second coolant channel 870B extends laterally along the backside of the underlying semiconductor device in the Y-axis direction.

The cold plate 806 further comprises a third inlet opening 808A, a fifth outlet opening 808B, and a sixth outlet opening 808C fluidly connected to a third coolant channel 870C. The third coolant channel 870C is defined by a third pair of parallel cavity sidewalls which extend between the third inlet opening 808A and the fifth and sixth outlet openings 808B, 808C (with the inlet opening 808A disposed between the outlet openings 808B,808C). A distance between the third inlet opening 808A and the fifth outlet opening 808B is less than a distance between the third inlet opening 808A and the sixth outlet opening 808C, such that the third inlet opening 808A is laterally offset from a hotspot region disposed centrally on an underlying semiconductor device. The third coolant channel 870C extends laterally along the backside of the underlying semiconductor device in a first diagonal direction between first and second opposing corners of the cold plate 806.

The cold plate 806 further comprises a fourth inlet opening 809A, a seventh outlet opening 809B, and a eighth outlet opening 809C fluidly connected to a fourth coolant channel 870D. The fourth coolant channel 870D is defined by a fourth pair of parallel cavity sidewalls which extend between the fourth inlet opening 809A and the seventh and eighth outlet openings 809B, 809C (with the inlet opening 809A disposed between the outlet openings 809B,809C). A distance between the fourth inlet opening 809A and the seventh outlet opening 809B is less than a distance between the fourth inlet opening 809A and the eighth outlet opening 809C, such that the fourth inlet opening 809A is laterally offset from a hotspot region disposed centrally on an underlying semiconductor device. The fourth coolant channel 870D extends laterally along the backside of the underlying semiconductor device in a second diagonal direction between third and fourth opposing corners of the cold plate 806. The first and third opposing corners are different corners to the third and fourth opposing corners. Therefore, an angle formed between adjacent coolant channels is substantially 45°.

A manifold (not shown) may be connected to each of the outlet openings in the above discussed embodiments in order to direct the coolant fluid to a common destination (e.g., an outlet coolant line).

Figure 9:
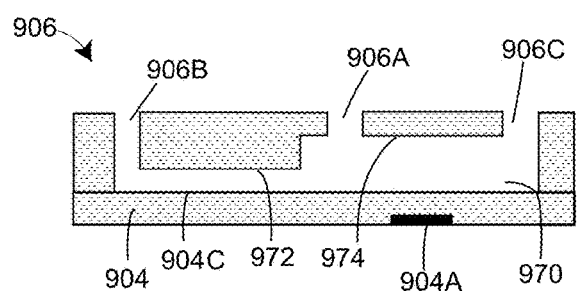
FIG. 9 is a schematic sectional view of an example device package, in accordance with embodiments of the disclosure.

Beneficially, by providing four separate coolant channels each having an laterally offset inlet opening disposed between different respective outlet openings, the rate of transfer of thermal energy from a hotspot region to a coolant fluid is further increased, which further improves the overall efficiency of the integrated cooling assembly. It should be understood that, in some embodiments, the size and shape (including length and width) of the channels may be different from one another FIG. 9 is a schematic sectional view of a cold plates 906 in the X-Z plane according to several of the previously described embodiments, e.g. illustrated by FIG. 6. The cold plate 906 is similar to the cold plate 606, and therefore the description of like elements has been omitted for brevity. The cold plate 906 comprises an inlet opening 906A disposed between a first outlet opening 906B and a second outlet opening 906C. The inlet opening 906A is laterally offset from a hotspot region 904A disposed centrally on an underlying semiconductor device 904. In FIG. 9, the inlet opening 906A is shown as being equidistant between the outlet openings. However, it will be understood that the inlet opening 906A may closer to one or the other of the outlet openings. The openings are fluidly connected to a coolant channel 970.

The cold plate 906 differs from the cold plate 606 in that the cold plate 906 comprises first and second portions comprising different features, respectively. In particular, a first portion of the cold plate 906 between the inlet opening 906A and the first outlet opening 906B comprises a narrower portion of the coolant channel 970 than a second portion of the cold plate 906 between the inlet opening 906A and the second outlet opening 906C.

Here, a portion of the base surface 972 in the first portion of the cold plate 906 comprises a greater thicknesses in the Z-axis direction than a portion of the base surface 974 in the second portion of the cold plate 906. As such, a vertical distance between the backside 904C of the semiconductor device and a portion of the base surface 972 in the first portion is less than a vertical distance between the backside 904C of the semiconductor device and a portion of the base surface 974 in the second portion. Therefore, a cross-section of the coolant channel 970 in the first portion is smaller than a cross-section of the coolant channel 970 in the second portion if the widths of the first and second portion of the coolant channel 970 in the lateral direction are identical. In some embodiments, the widths of the first and second portions may be different. As shown, cold plate 906 is formed such that the second portion is disposed above the hotspot region 904A and the inlet opening 906A remains laterally offset from the hotspot region 904A. The flow of coolant fluid through the coolant channel is more restricted between the inlet opening 906A and the first outlet opening 906B (in the first portion) than between the inlet opening 906A and the second outlet opening 906C (in the second portion). Therefore, a flow rate of coolant fluid across the hotspot region 904A in the second portion is greater than a flow rate in the first portion, which further increases the efficiency of device cooling.

Figure 10:
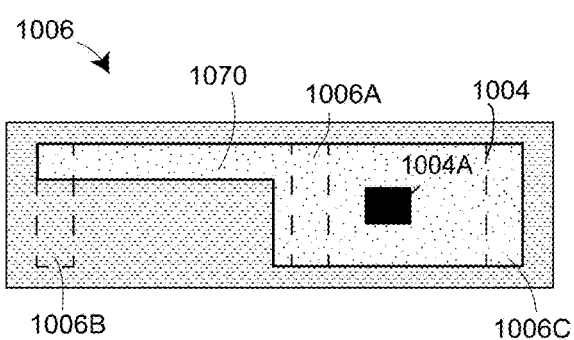
FIG. 10 is a schematic sectional view of an example device package, in accordance with embodiments of the disclosure.

FIG. 10 is schematic sectional views of a cold plate 1006 in the X-Y plane according to embodiments illustrated by FIG. 6. The cold plate 1006 is similar to the cold plate 606, and therefore the description of like elements has been omitted for brevity. The cold plate 1006 comprises an inlet opening 1006A disposed between a first outlet opening 1006B and a second outlet opening 1006C. The openings are illustrated using dashed lines in FIG. 10 to show where the openings are positioned in the Z-axis direction. The inlet opening 1006A is laterally offset from a hotspot region 1004A disposed centrally on an underlying semiconductor device 1004. In FIG. 10, the inlet opening 1006A is shown as being equidistant between the outlet openings. However, it will be understood that the inlet opening 1006A may be closer to one or the other of the outlet openings. The openings are fluidly connected to a coolant channel 1070.

The cold plate 1006 differs from the cold plate 606 in that the cold plate 1006 comprises first and second portions comprising different features, respectively. In particular, a first portion of the cold plate 1006 between the inlet opening 1006A and the first outlet opening 1006B comprises a narrower portion of the coolant channel 1070 than a second portion of the cold plate 1006 between the inlet opening 1006A and the second outlet opening 1006C.

Here, a horizontal distance (in the Y-axis direction) between portions of opposing cavity sidewalls in the first portion of the cold plate 1006 is less than a horizontal distance (in the Y-axis direction) between portions of opposing cavity sidewalls in the second portion of the cold plate 1006. Therefore, a cross-section of the coolant channel 1070 in the first portion is smaller than a cross-section of the coolant channel 1070 in the second portion. The cold plate 1006 is formed such that the second portion is disposed above the hotspot region 1004A and the inlet opening 1006A remains laterally offset from the hotspot region 1004A. The flow of coolant fluid through the coolant channel 1070 is more restricted between the inlet opening 1006A and the first outlet opening 1006B (in the first portion) than between the inlet opening 1006A and the second outlet opening 1006C (in the second portion). Therefore, a flow rate of coolant fluid across the hotspot region 1004A in the second portion is greater than a flow rate in the first portion, which further increases the efficiency of device cooling.

Figure 11:
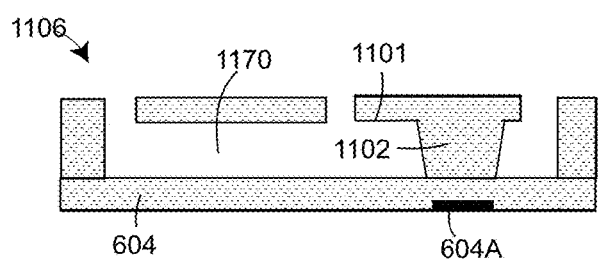
FIG. 11 is a schematic sectional view of an example device package, in accordance with embodiments of the disclosure.

FIG. 11 is schematic sectional views of a cold plates 1106 in the X-Z plane according to embodiments illustrated by FIG. 6. The cold plate 1106 is similar to the cold plate 606, and therefore the description of like elements has been omitted for brevity. The cold plate 1106 differs from the cold plate 606 in that the cold plate 1006 comprises a support feature 1102 extending downwardly from a base surface 1101 of the cold plate 1106 into the coolant channel 1170. As shown, the support feature 1102 is disposed above a hotspot region 604A of the underlying semiconductor device 604, such that thermal flux generated by the hotspot region 604A is at least partially absorbed by the support feature 1102. As discussed above, the inlet opening of the cold plate may be disposed over (i.e. overlap) or slightly offset from the processing core region (e.g. CPU, GPU, NPU, etc.) of a semiconductor device to which the cold plate is attached. Such core regions may generally have higher power and thermal density than the adjacent regions of a semiconductor device. In some embodiments, the support feature 1102 is disposed above a comparatively hotter (or hottest) portion of the hotspot region 604A. In some embodiments the support feature 1102 comprises silicon. Further, in some embodiments, the support feature 1102 is connected to (e.g., directly bonded to) the hotspot region 604A of the semiconductor device 604.

The above description of embodiments illustrated in FIGS. 9 to 12 relate to a single coolant channel. However, it will be understood that these embodiments could be combined alone or together with the embodiments illustrated in FIGS. 7 and 8 to include plural channels in the same cold plate.

Figure 12:
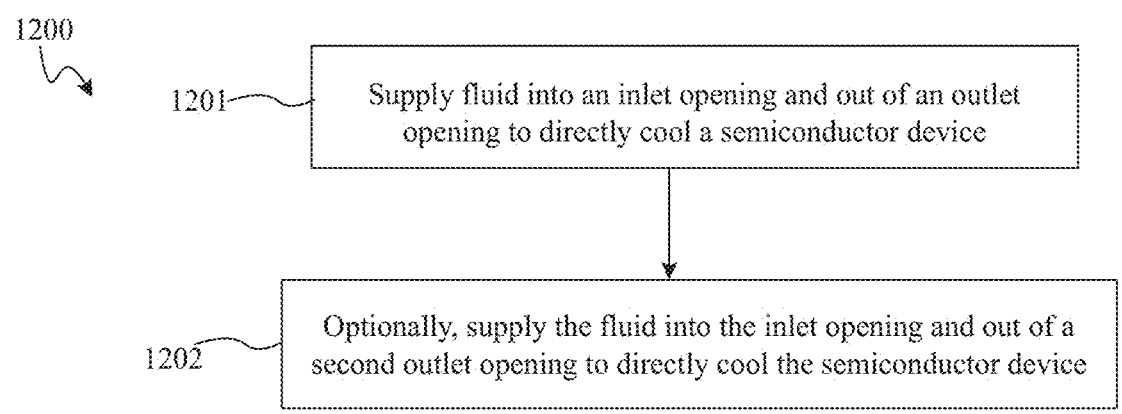
FIG. 12 shows a method of using a device package in accordance with one or more embodiments.

FIG. 12 is a method 1200 of using the device package in accordance with one or more embodiments as described above in relation to FIGS. 2G to 5. At step 1201, a fluid is supplied into an inlet opening and out of an outlet opening to directly cool a semiconductor device. For example, with reference to FIG. 2G, coolant fluid may be supplied (e.g., delivered) into the inlet opening 206C of the cold plate 206 from coolant lines 108. The coolant fluid may subsequently pass through the coolant chamber volume 270 of the cold plate 206 and exit the coolant chamber volume via the outlet opening 206B.

At step 1202, optionally, the fluid is supplied into the inlet opening and out of first and second outlet opening to directly cool the semiconductor device. That is, the cold plate 206 may comprise a single inlet opening and plural outlet openings through which coolant fluid may flow.

In some embodiments, suppling the fluid may comprise supplying different types of coolant fluid. For example, the fluid may comprise a mixture of water and glycol. In other embodiments, a first fluid (e.g., water) may be supplied to the inlet opening and directed to a first outlet opening (e.g., using first dividers), and a second fluid (e.g., glycol) may be supplied to the inlet opening and directed to a second opening (e.g., using second dividers). In such embodiments, a flow rate of the first fluid may be different from a flow rate of the second fluid (where flow rate is defined as the volume of coolant fluid which flows through the inlet opening per unit of time, e.g., m$^3$/s). For example, the flow rate of the first fluid may be greater than the flow rate of the second fluid, or vice versa.

In some embodiments, the cold plate may comprise two inlet openings and two outlet openings. First dividers may direct a first fluid from a first inlet opening to a first outlet opening and second dividers may direct a second fluid from a second inlet opening to a second outlet opening. In such embodiments, the first fluid and the second fluid may flow in different directions to one another. For example, the first inlet opening and the second outlet opening may be disposed at one side of the cold plate, and the second inlet opening and the first outlet opening may be disposed at an opposite side of the cold plate. In such an arrangement, first and second fluids flow between the respective openings in opposite directions to one another.

In some embodiments, the first and second fluids may each form parts of different fluid flow loops. For example, the first fluid may flow along a first fluid flow loop comprising the first inlet opening, the first outlet opening, first coolant lines, and the coolant chamber volume. Similarly, the second fluid may flow along a second fluid flow loop comprising the second inlet opening, the second outlet opening, second coolant lines, and the coolant chamber volume.

In embodiments comprising first and second fluids, the first fluid may be cooled to a first temperature, the second fluid may be cooled to a second temperature, and the first temperature may be different from the second temperature. For example, the first fluid may be supplied using first coolant lines fluidly coupled to a first coolant source and the second fluid may be supplied using second coolant lines fluidly coupled to a second coolant source. The first coolant source may comprise a heat exchanger or chiller to maintain the first fluid at the first temperature and the second coolant source may comprise another heat exchanger or chilled to maintain the second fluid at the second temperature.

Figure 13:
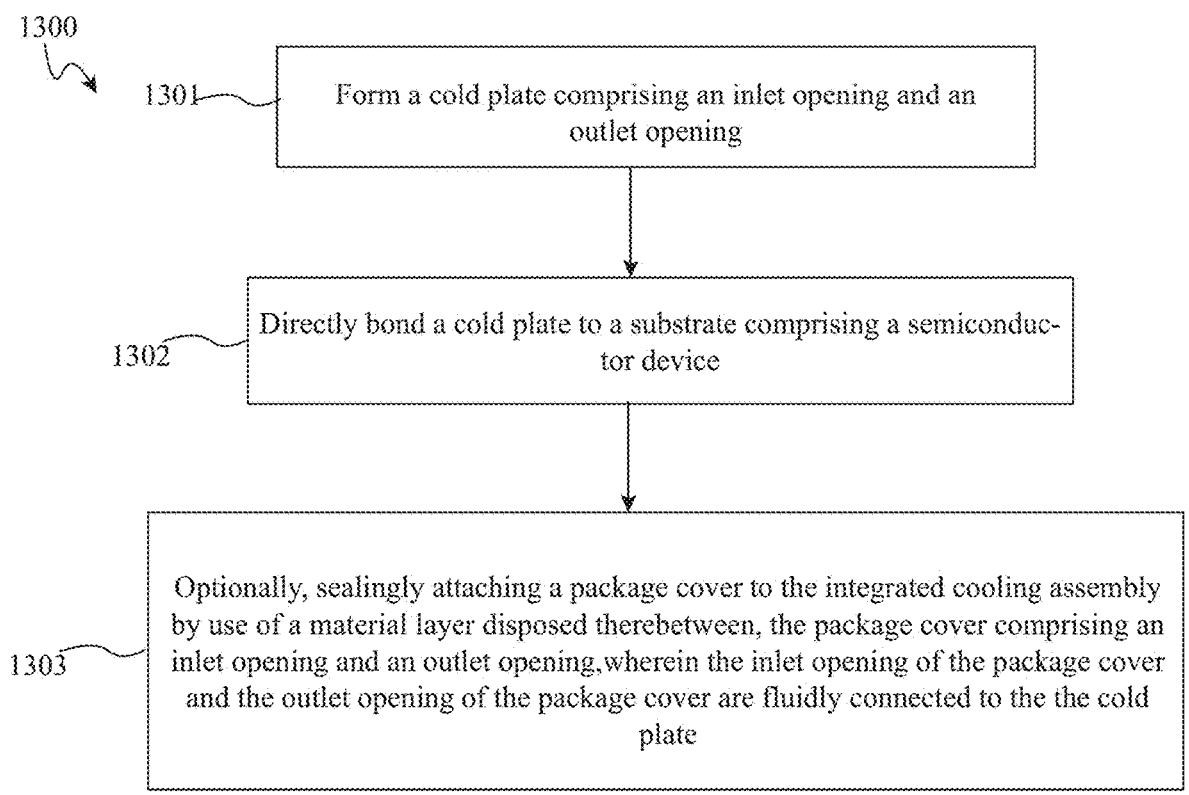
FIG. 13 shows a method that can be used to manufacture a device package in accordance with one or more embodiments.

FIG. 13 is a method 1300 of manufacturing a device package in accordance with one or more embodiments. At step 1301, the method includes forming the cold plate 206 comprising an inlet opening and an outlet opening. For example, the cold plate 206 may be etched to form the inlet opening, the outlet opening and a coolant chamber volume, using a patterned mask layer formed on surfaces of the cold plate 206. The anisotropic etch process uses inherently differing etch rates for the silicon material which is exposed to an anisotropic etchant when the patterned mask layer is formed.

At step 1302, the cold plate 206 is directly bonded to a substrate comprising a semiconductor device. The substrate may include a bulk material, semiconductor material, and/or a plurality of material layers disposed on the bulk material. In other embodiments, the substrate may comprise a reconstituted substrate, e.g., a substrate formed from a plurality of singulated devices embedded in a support material.

The bulk material of the substrate may be thinned after the devices are formed using one or more backgrind, etching, and polishing operations that remove material from the backside. Thinning the substrate may include using a combination of grinding and etching processes to reduce the thickness (in the Z-direction) to about 450 µm or less, such as about 201 µm or less, or about 150 µm or less. After thinning, the backside may be polished to a desired smoothness using a chemical mechanical polishing (CMP) process, and the dielectric material layer may be deposited thereon. In some embodiments, the dielectric material layer may be polished to a desired smoothness to prepare the substrate for the bonding process.

In some embodiments, an active side is temporarily bonded to a carrier substrate (not shown) before or after the thinning process. When used, the carrier substrate provides support for the thinning operation and/or for the thinned material to facilitate substrate handling during one or more of the subsequent manufacturing operations described herein.

Here, the method 1300 may include forming dielectric layers on the cold plate 206 and the substrate, and directly bonding includes forming dielectric bonds between a first dielectric material layer of the cold plate 206 and a second dielectric material layer of the substrate.

In some embodiments, the dielectric bonds may be formed using a dielectric material layer deposited on the substrate and the cold plate 206. In those embodiments, the direct dielectric bonds may be formed by contacting the deposited dielectric material layer of the substrate directly with a bulk material surface of the cold plate 206.

Optionally, at step 1303 a package cover is sealingly attaching to the integrated cooling assembly by use of a material layer disposed therebetween, the package cover comprising an inlet opening and an outlet opening, wherein the inlet opening of the package cover and the outlet opening of the package cover are fluidly connected to the cold plate.

Figure 14:
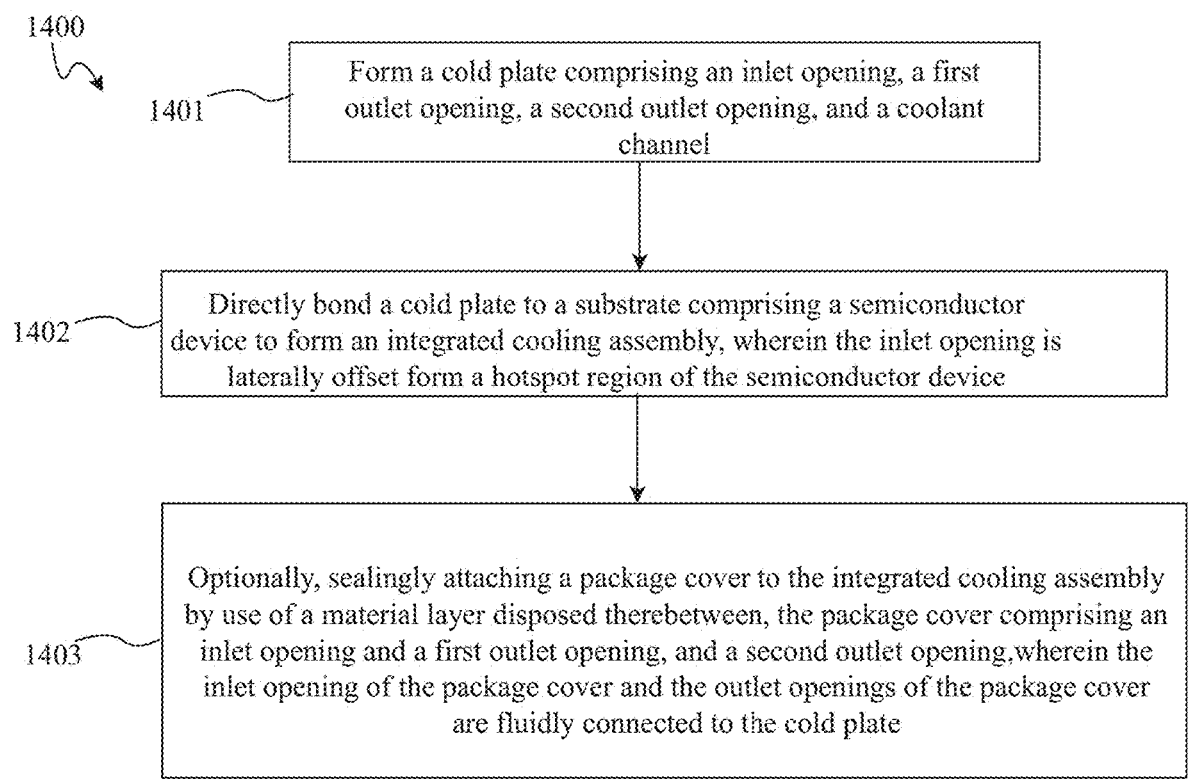
FIG. 14 shown another method that can be used to manufacture a device package in accordance with one or more embodiments.

FIG. 14 is a method 1400 of manufacturing a device package in accordance with one or more embodiments. At step 1401, the method includes forming the cold plate 606 comprising an inlet opening, a first outlet opening, a second outlet opening, and a cooling channel. For example, the cold plate 606 may be dry etched to form the inlet opening, the first outlet opening, the second outlet opening, and the coolant channel, using a patterned mask layer formed on surfaces of the cold plate 606. An anisotropic dry etch process may be used, in which inherently differing etch rates are used for the silicon material which is exposed to an anisotropic etchant when the patterned mask layer is formed.

At step 1402, the cold plate 606 is directly bonded to a substrate comprising a semiconductor device. The substrate may include a bulk material, and a plurality of material layers disposed on the bulk material, as discussed above in relation to method 1300.

Here, the method 1400 may include forming dielectric layers on the cold plate 606 and the substrate, and directly bonding includes forming dielectric bonds between a first dielectric material layer of the cold plate 606 and a second dielectric material layer of the substrate, as discussed above in relation to method 1300.

Optionally, at step 1403 a package cover is sealingly attaching to the integrated cooling assembly by use of a material layer disposed therebetween, the package cover comprising an inlet opening, a first outlet opening and a second outlet opening, wherein the inlet opening of the package cover and the outlet openings of the package cover are fluidly connected to the cold plate.

Figure 15:
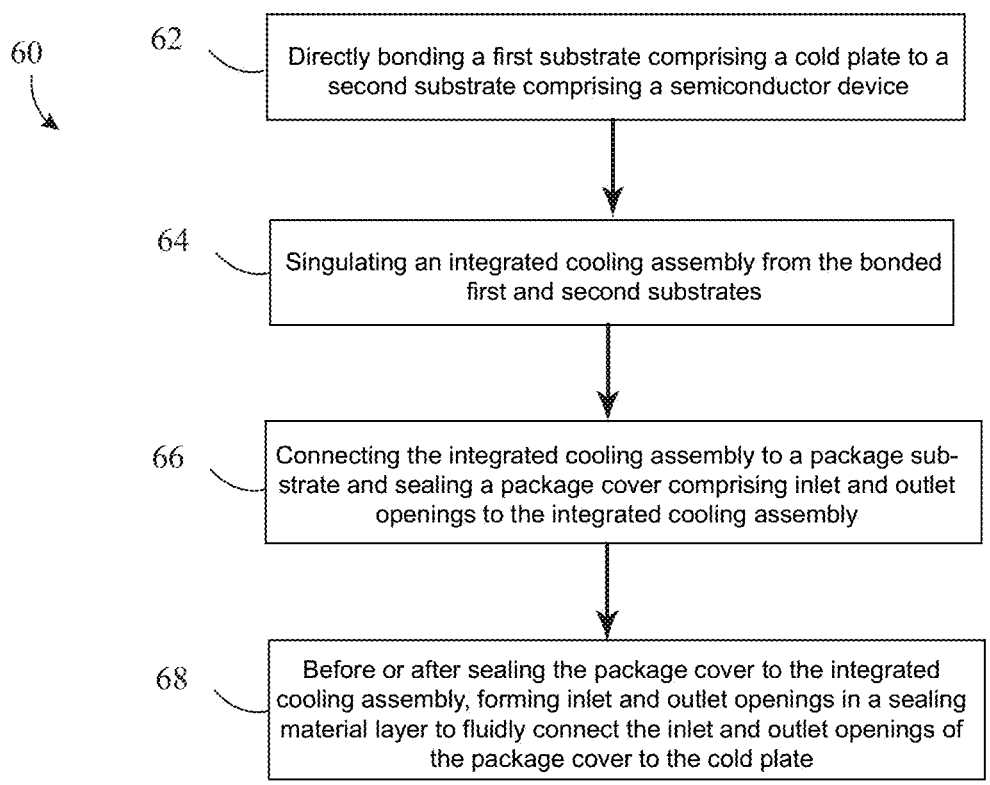
FIG. 15 shows a method that can be used to manufacture the device package described herein.

FIG. 15 is a flow diagram showing a method 60 of forming an integrated cooling assembly, according to embodiments of the present disclosure. Generally, the method 60 includes bonding a first substrate comprising one or more cold plates 206 to a second substrate comprising one or more semiconductor devices 204, and singulating one or more integrated cooling assemblies 203 from the bonded first and second substrates. For example, a wafer (bare or reconstituted wafer) comprising one or more cold plates 206 can be directly bonded to another wafer (bare or reconstituted wafer) comprising one or more semiconductor devices 204.

It will be understood that the first substrate may be a cold plate die or part of a wafer of cold plates. Further, the second substrate may be a semiconductor device die or part of a wafer of semiconductor devices 204. Therefore, the method 60 may include die-to-die direct bonding (e.g., cold plate die to semiconductor device die), wafer-to-die direct bonding (e.g., cold plate die to semiconductor device wafer, or cold plate wafer to semiconductor device die), and wafer-to-wafer direct bonding (e.g., cold plate wafer to semiconductor device wafer). It will be understood that the singulation step (discussed in relation to block 64, below) may not be required for a die-to-die direct bonding operation.

For simplicity, the following description is focused on forming one integrated cooling assembly 203 comprising one cold plate 206 and one semiconductor device 204. However, as mentioned above, in some embodiments, the first substrate may comprise plural cold plates 206 and the second substrate may comprise plural semiconductor devices 204, such that plural integrated cooling assemblies 203 may be formed from the first and second substrates.

At block 62, the method 60 includes directly bonding the first substrate (e.g., a monocrystalline silicon wafer) comprising a cold plate 206 to the second substrate (e.g., a monocrystalline silicon wafer) comprising a semiconductor device 204 without an intervening adhesive.

In some embodiments, the first substrate may be etched using a patterned mask layer formed on its surface to form features of the cold plate 206. An anisotropic etch process may be used, which uses inherently differing etch rates for the silicon material as between {100} plane surfaces and {111} plane surfaces when exposed to an anisotropic etchant.

In some embodiments, the etching process is controlled to where the etch rates of the substrate surfaces have a ratio between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide ($HN_4OH$), hydrazine ($N_2H_4$), or tetra methyl ammonium hydroxide (TMAH). The actual etch rates of the silicon substrate depend on the concentration of the etchant in the aqueous solution, the temperature of the aqueous solution, and a concentration of the dopant in the substrate (if any). Typically, the mask layer is formed of a material that is selective to anisotropic etch compared to the underlying monocrystalline silicon substrate. Examples of suitable mask materials include silicon oxide ($Si_xO_y$) or silicon nitride ($Si_xN_y$). In some embodiments, the mask layer has a thickness of about 100 nm or less, such as about 50 nm or less, or about 30 nm or less. The mask layer may be patterned using any suitable combination of lithography and material etching patterning methods.

The second substrate may include a bulk material, and a plurality of material layers disposed on the bulk material. The bulk material may include any semiconductor material suitable for manufacturing semiconductor devices, such as silicon, silicon carbide, silicon germanium, germanium, group III-V semiconductor materials, group II-VI semiconductor materials, or combinations thereof. While some high-performance processors like CPUs, GPUs, neural processing units (NPUs), and tensor processing units (TPUs) are typically made out of silicon, some other high power density (hence substantial heat-generating) devices may comprise silicon carbide or gallium nitride, for example. In some embodiments, the second substrate may include a monocrystalline wafer, such as a silicon wafer, a plurality of device components formed in or on the silicon wafer, and a plurality of interconnect layers formed over the plurality of device components. In other embodiments, the second substrate may comprise a reconstituted substrate, e.g., a substrate formed from a plurality of singulated devices embedded in a support material. In some embodiments, each semiconductor device may have its own individual cold plate fabricated through a reconstitution process.

The bulk material of the second substrate may be thinned after the semiconductor device 204 is formed using one or more backgrinding, etching, and polishing operations that remove material from the backside. Thinning the second substrate may include using a combination of grinding and etching processes to reduce the thickness (in the Z-direction) to about 450 μm or less, such as about 200 μm or less, or about 150 μm or less or about 50 μm or less. After thinning, the backside 220 may be polished to a desired smoothness using a chemical mechanical polishing (CMP) process, and the dielectric material layer may be deposited thereon. In some embodiments, the dielectric material layer may be polished to a desired smoothness to prepare the second substrate for the bonding process. In some embodiments, the method 60 includes forming a plurality of metal features in the dielectric material layer in preparation for a hybrid bonding process, such as by use of a damascene process.

In some embodiments, the active side of the second substrate is temporarily bonded to a carrier substrate (not shown) before or after the thinning process. When used, the carrier substrate provides support for the thinning operation and/or for the thinned material to facilitate substrate handling during one or more of the subsequent manufacturing operations described herein.

Here, the method 60 may include forming dielectric layers on one or both the first and second substrates, and directly bonding includes forming dielectric bonds between a first dielectric material layer of the first substrate and a second dielectric material layer of the second substrate (or forming dielectric bonds between one substrate and a dielectric material layer of the other substrate). Direct bonding processes join dielectric layers by forming strong chemical bonds (e.g., covalent bonds) between the dielectric layers.

Generally, directly bonding the surfaces (of the dielectric material layers formed on the first and second substrates) includes preparing, aligning, and contacting the surfaces. Examples of dielectric material layers include silicon oxide, silicon nitride, silicon oxynitride, and silicon carbonitride. Preparing the surfaces may include smoothing the respective surfaces to a desired surface roughness, such as between 0.1 to 3.0 nm RMS, activating the surfaces to weaken or open chemical bonds in the dielectric material, and terminating the surfaces with a desired species. Smoothing the surfaces may include polishing the first and second substrates using a CMP process. Activating and terminating the surfaces with a desired species may include exposing the surfaces to radical species formed in a plasma. The bond interface between the bonded dielectric layers can include a higher concentration of materials from the activation and/or last chemical treatment processes compared to the bulk of the bonding layers. For example, in some embodiments that utilize a nitrogen plasma for activation, a nitrogen concentration peak can be formed at the bond interface. In some embodiments, the nitrogen concentration peak may be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen concentration peak can be formed at the bond interface between non-conductive bonding surfaces.

In some embodiments, the plasma is formed using a nitrogen-containing gas, e.g., $N_2$, and the terminating species includes nitrogen, or nitrogen and hydrogen. In some embodiments, fluorine may also be present within the plasma. In some embodiments, the surfaces may be activated using a wet cleaning process, e.g., by exposing the surfaces to an aqueous ammonia solution. In some embodiments, the dielectric bonds may be formed using a dielectric material layer deposited on only one of the first and second substrates, but not on both. In those embodiments, the direct dielectric bonds may be formed by contacting the deposited dielectric material layer of one of the first and second substrates directly with a bulk material surface (or such a surface with a native oxide) of the other substrate.

Directly forming direct dielectric bonds between the first and second substrates at block 62 may include bringing the prepared and aligned surfaces into direct contact at a temperature less than 150° C., such as less than 100° C., for example, less than 30° C., or about room temperature, e.g., between 20° C. and 30° C. Without intending to be bound by theory, in the case of directly bonding surfaces terminated with nitrogen and hydrogen (e.g., $NH_2$ groups), it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C., for a duration of about 5 minutes or more, such as about 15 minutes. Typically, the bonds will strengthen over time even without the application of heat. Thus, in some embodiments, the method does not include heating the substrates.

In embodiments where the first and second substrates are bonded using hybrid dielectric and metal bonds, the method 60 may further include planarizing or recessing the metal features below the dielectric field surface before contacting and bonding the dielectric material layers. After the dielectric bonds are formed, the first and second substrates may be heated to a temperature of 150° C. or more and maintained at the elevated temperature for a duration of about 1 hour or more, such as between 8 and 24 hours, to form direct metallurgical bonds between the metal features.

Suitable direct dielectric and hybrid bonding technologies that may be used to perform aspects of the methods described herein include ZiBond® and DBI®, each of which are commercially available from Adeia Holding Corp., San Jose, CA, USA.

At block 64, the method 60 includes singulating at least one integrated cooling assembly 203 from the bonded first and second substrates. Singulation after bonding may impart distinctive structural characteristics on the integrated cooling assembly 203 as the bonding surface of the cold plate 206 has the same perimeter as the backside of the semiconductor device 204 bonded thereto. Thus, the sidewalls (e.g., side surfaces) of the cold plate 206 are typically flush with the edges (e.g., side surfaces) of the semiconductor device 204 about their common perimeters. In some embodiments, the cold plate 206 is singulated from the first substrate using a process that cuts or divides the first substrate in a vertical plane, i.e., in the Z-direction. In those embodiments, the side surfaces of the cold plate 206 are substantially perpendicular to the backside 220 of the semiconductor device 204, i.e., a horizontal (X-Y) plane of an attachment interface between the semiconductor device 204 and the cold plate 206. In some embodiments, the cold plate 206 is singulated using a saw or laser dicing process.

At block 66, the method 60 may include connecting the integrated cooling assembly 203 to the package substrate 202 and sealing a package cover 208 comprising inlet and outlet openings 212 to the integrated cooling assembly 203 by use of a molding compound that, when cured, forms a sealing material layer 222.

At block 68, the method 60 may include, before or after sealing the package cover 208 to the integrated cooling assembly 203, forming inlet and outlet openings 222A in the sealing material layer 222 to fluidly connect the inlet and outlet openings 212 of the package cover 208 to the cold plate 206.

The method described above advantageously provides for integrated cooling assemblies that reduce a temperature difference across a semiconductor device to improve temperature uniformity.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure.

What is claimed is:

1. A device package comprising:
an integrated cooling assembly comprising a semiconductor device and a cold plate directly bonded to the semiconductor device, wherein the cold plate is attached to the semiconductor device by direct dielectric bonds, and the cold plate comprises:
a top portion;
sidewalls extending downwardly from the top portion to a backside of the semiconductor device;
an inlet opening; and
an outlet opening, wherein:
the top portion, the sidewalls, and the backside of the semiconductor device collectively define a coolant chamber volume therebetween;
the inlet opening and the outlet opening are disposed in the top portion and are in fluid communication with the coolant chamber volume; and
the inlet opening is disposed above a hotspot region of the semiconductor device.

2. The device package according to claim 1, wherein:
the outlet opening is disposed above an adjacent region;
the semiconductor device operates at a first temperature in the hotspot region and operates at a second temperature in the adjacent region; and
the first temperature is greater than the second temperature.

3. The device package according to claim 2, wherein:
the semiconductor device comprises at least one of a computational core, neural core or graphical processing unit;
the hotspot region is formed by the at least one of the computational core, neural core or graphical processing unit forms the hotspot region; and
the semiconductor device comprises at least one of a memory block, I/O block, PHY block, SERDES block or analog block disposed in the adjacent region.

4. The device package according to claim 2, wherein:
the outlet opening is a first outlet opening;
the adjacent region is a first adjacent region;
the cold plate comprises a second outlet opening disposed in the top portion and in fluid communication with the coolant chamber volume; and
the second outlet opening is disposed above a second adjacent region of the semiconductor device.

5. The device package according to claim 2 wherein:
the inlet opening is a first inlet opening and the hotspot region is a first hotspot region;
the cold plate comprises a second inlet opening disposed in the top portion and in fluid communication with the coolant chamber volume;
the second inlet opening is disposed above a second hotspot region of the semiconductor device.

6. The device package according to claim 5, wherein:
the semiconductor device operates at a first temperature in the first hotspot region, operates at a second temperature in the adjacent region, and operates at a third temperature in the second hotspot region; and
the first and third temperatures are greater than the second temperature.

7. The device package according to claim 4, wherein the cold plate comprises a third outlet opening and a fourth outlet opening.

8. The device package according to claim 7, wherein:
the inlet opening is disposed over a central region of the semiconductor device; and
the first, second, third and fourth outlet openings are positioned symmetrically with respect to an axis perpendicular to and in a plane of the central region.

9. The device package according to claim 1, wherein the inlet opening and the outlet opening comprise different cross-sectional dimensions.

10. The device package according to claim 2, wherein a cross-sectional dimension of the inlet opening is directly proportional to the first temperature.

11. The device package according to claim 2, wherein a cross-sectional dimension of the outlet opening is directly proportional to the second temperature.

12. The device package according to claim 1, further comprising:
a package substrate upon which the integrated cooling assembly is disposed;
a package cover disposed on a peripheral portion of the package substrate, the package cover extending over the integrated cooling assembly so that the integrated cooling assembly is disposed between the package substrate and the package cover; and
a sealing material layer that forms a fluid impermeable barrier between the package cover to the integrated cooling assembly.

13. The device package according to claim 1, further comprising: a divider extending downwardly from the top portion to the backside of the semiconductor device, wherein:
the divider extends laterally between the inlet opening and the outlet opening to define a fluid channel therebetween.

14. The device package according to claim 13, further comprising plural dividers extending downwardly from the top portion to the backside of the semiconductor device, wherein:
each divider extends laterally between the inlet opening and the outlet opening; and
the dividers are spaced apart from each other to define plural fluid channels between the inlet opening and the outlet opening.

15. A device package comprising:
an integrated cooling assembly comprising a semiconductor device and a cold plate directly bonded to the semiconductor device, wherein the cold plate is attached to the semiconductor device by direct dielectric bonds, and the cold plate comprises:
a top portion;
sidewalls extending downwardly from the top portion to a backside of the semiconductor device;
an inlet opening; and
an outlet opening, wherein:
the top portion, the sidewalls, and the backside of the semiconductor device collectively define a coolant chamber volume therebetween;
the inlet opening and the outlet opening are disposed in the top portion and are in fluid communication with the coolant chamber volume; and
the inlet opening is disposed above at least one of a computational core, neural core or graphical processing unit of the semiconductor device.

16. A device package comprising:
an integrated cooling assembly comprising a semiconductor device and a cold plate directly bonded to the semiconductor device, wherein the cold plate comprises:
a base surface;
opposing cavity sidewalls extending downwardly from the base surface to a backside of the semiconductor device;
an inlet opening;
a first outlet opening; and
a second outlet opening, wherein:
the base surface, the opposing cavity sidewalls, and the backside of the semiconductor device collectively define a coolant channel therebetween;
the inlet opening, the first outlet opening and the second outlet opening are in fluid communication with the coolant channel; and
the inlet opening is disposed between the first and second outlet openings.

17. The device package according to claim 16, wherein:
the semiconductor device comprises at least one of a computational core, neural core or graphical processing unit; and
the at least one of the computational core, neural core or graphical processing unit forms a hotspot region.

18. The device package according to claim 16, wherein the hotspot region is a central portion of the semiconductor device.

19. The device package according to claim 1, wherein the cold plate is attached to the semiconductor device by direct hybrid bonds.

20. The device package according to claim 1, wherein the hotspot region has at least one of a power density greater than an average power density of the semiconductor device, a surface through which heat energy passes at an amount exceeding a predetermined value, or a temperature that exceeds a predetermined temperature.

* * * * *